(12) United States Patent
Tao et al.

(10) Patent No.: US 8,053,162 B2
(45) Date of Patent: Nov. 8, 2011

(54) SUBSTRATE AND IMAGEABLE ELEMENT WITH HYDROPHILIC INTERLAYER

(75) Inventors: Ting Tao, Fort Collins, CO (US); Shashikant Saraiya, Fort Collins, CO (US); Eric E. Clark, Loveland, CO (US); Frederic E. Mikell, Greeley, CO (US)

(73) Assignee: Eastman Kodak Company, Rochester, NY (US)

( * ) Notice: Subject to any disclaimer, the term of this patent is extended or adjusted under 35 U.S.C. 154(b) by 726 days.

(21) Appl. No.: 12/140,545

(22) Filed: Jun. 17, 2008

(65) Prior Publication Data

US 2009/0311482 A1    Dec. 17, 2009

(51) Int. Cl.
G03F 7/00    (2006.01)
G03F 7/26    (2006.01)

(52) U.S. Cl. ................................ 430/270.1; 430/302
(58) Field of Classification Search .............. 430/270.1, 430/302; 101/450.1; 428/172
See application file for complete search history.

(56) References Cited

U.S. PATENT DOCUMENTS

| | | | |
|---|---|---|---|
| 4,427,765 A | | 1/1984 | Mohr et al. |
| 5,314,787 A | | 5/1994 | Elsaesser et al. |
| 5,807,659 A | | 9/1998 | Nishimiya et al. |
| 6,218,075 B1 | | 4/2001 | Kimura et al. |
| 7,049,048 B2 | | 5/2006 | Hunter et al. |
| 7,214,468 B2 | | 5/2007 | Takahashi et al. |
| 2004/0260050 A1 * | 12/2004 | Munnelly et al. ............ | 528/176 |
| 2006/0040117 A1 * | 2/2006 | Hayashi et al. ............... | 428/457 |
| 2006/0046198 A1 | 3/2006 | Hunter et al. | |
| 2008/0280228 A1 * | 11/2008 | Hayashi et al. ............ | 430/272.1 |

FOREIGN PATENT DOCUMENTS

| | | |
|---|---|---|
| EP | 1 178 474 | 2/2002 |
| EP | 1 396 339 A2 | 3/2004 |
| EP | 1 495 866 | 1/2005 |
| EP | 1 516 747 A1 | 3/2005 |
| EP | 1 788 429 | 5/2007 |
| EP | 1 865 378 A1 | 12/2007 |
| EP | 1 791 699 | 1/2008 |
| WO | 2006/021446 | 3/2006 |
| WO | 2006/028440 | 3/2006 |

* cited by examiner

*Primary Examiner* — Cynthia Kelly
*Assistant Examiner* — Chanceity Robinson
(74) *Attorney, Agent, or Firm* — J. Lanny Tucker

(57) ABSTRACT

A substrate useful for forming lithographic printing plate precursors includes a metal or polymer support and an interlayer comprising a trialkoxysilyl polyethylene glycol acrylate having the following Structure (I):

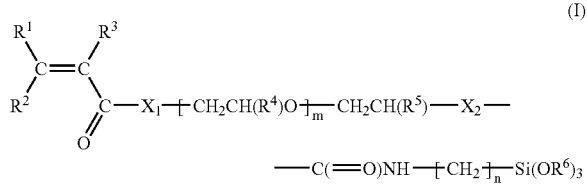

wherein $R^1$ and $R^2$ are independently hydrogen or $C_1$ to $C_6$ alkyl, $C_1$ to $C_6$ alkenyl, $C_1$ to $C_6$ alkoxy, $C_1$ to $C_6$ acyl, $C_1$ to $C_6$ acyloxy, phenyl, halo, or cyano groups, or $R^1$ and $R^2$ together can form a cyclic group, $R^3$ is hydrogen, or a $C_1$ to $C_6$ alkyl, phenyl, halo, or cyano group, $R^4$ and $R^5$ are independently hydrogen or methyl groups, $R^6$ is hydrogen or a $C_1$ to $C_{12}$ alkyl group, $X_1$ is —O— or —NR— wherein R is hydrogen or an alkyl or aryl group, $X_2$ is —NR'— wherein R' is hydrogen or an alkyl or aryl group, m is an integer of from 15 to 200, and n is an integer of from 1 to 12. The lithographic printing plates can be negative-working and particularly useful for on-press development and have a sulfuric acid-anodized aluminum support.

18 Claims, No Drawings

SUBSTRATE AND IMAGEABLE ELEMENT WITH HYDROPHILIC INTERLAYER

FIELD OF THE INVENTION

This invention relates to hydrophilic substrates having a unique interlayer and to imageable elements such as negative-working lithographic printing plate precursors having the noted hydrophilic substrate. The invention also relates to methods of using these imageable elements.

BACKGROUND OF THE INVENTION

Radiation-sensitive compositions are routinely used in the preparation of imageable materials including lithographic printing plate precursors. Such compositions generally include a radiation-sensitive component, an initiator system, and a binder, each of which has been the focus of research to provide various improvements in physical properties, imaging performance, and image characteristics.

Recent developments in the field of printing plate precursors concern the use of radiation-sensitive compositions that can be imaged by means of lasers or laser diodes, and more particularly, that can be imaged and/or developed on-press. Laser exposure does not require conventional silver halide graphic arts films as intermediate information carriers (or "masks") since the lasers can be controlled directly by computers. High-performance lasers or laser-diodes that are used in commercially-available image-setters generally emit radiation having a wavelength of at least 700 nm, and thus the radiation-sensitive compositions are required to be sensitive in the near-infrared or infrared region of the electromagnetic spectrum. However, other useful radiation-sensitive compositions are designed for imaging with ultraviolet or visible radiation.

There are two possible ways of using radiation-sensitive compositions for the preparation of printing plates. For negative-working printing plates, exposed regions in the radiation-sensitive compositions are hardened and unexposed regions are washed off during development. For positive-working printing plates, the exposed regions are dissolved in a developer and the unexposed regions become an image.

Various negative-working radiation compositions and imageable elements are described in and U.S. Pat. Nos. 6,309,792 (Hauck et al.), 6,569,603 (Furukawa), 6,893,797 (Munnelly et al.), 6,787,281 (Tao et al.), and 6,899,994 (Huang et al.), U.S. Patent Application Publications 2003/0118939 (West et al.), 2005/0008971 (Mitsumoto et al.), and 2005/0204943 (Makino et al.), and EP 1,079,276A (Lifka et al.), EP 1,182,033A (Fujimaki et al.), and EP 1,449,650A (Goto).

Independently of the type of imageable element, lithography has generally been carried out using a polymeric or metal substrate (or "support") such as a substrate comprising an aluminum or aluminum alloy support of various metallic compositions. The surface of the metal sheet is generally roughened by surface graining in order to ensure good adhesion to a layer, usually an imageable layer, that is disposed thereon and to improve water retention in non-imaged regions during printing. Various aluminum support materials and methods of preparing them are described in U.S. Pat. Nos. 5,076,899 (Sakaki et al.) and 5,518,589 (Matsura et al.).

For example, to prepare aluminum-containing substrates for lithographic elements, a continuous web of raw aluminum can be treated, for example, using a sequence of known steps. Such steps may include taking the continuous aluminum web through a degreasing section of a manufacturing machine to remove oils and debris from the aluminum web, an alkali etching section, first rinsing section, graining section (that can include mechanical or electrochemical graining, or both), second rinsing section, post-graining acidic- or alkali-etching section, third rinsing section, anodization section using a suitable acid to provide an anodic oxide coating, fourth rinsing section, post-treatment section, final or fifth rinsing section, and drying section, before either being rewound or passed on to coating stations for application of imageable layer formulations.

In the anodization section, the aluminum web is treated to form an aluminum oxide layer on its surface so it will exhibit a high degree of mechanical abrasion resistance necessary during the printing process. This oxide layer is already hydrophilic to some degree, which is significant for having a high affinity for water and for repelling printing ink. However, the oxide layer is so reactive that it can interact with components of the imageable layer in the imageable element. The oxide layer may partially or completely cover the aluminum substrate surface.

In the post-treatment section, the oxide layer is covered with a hydrophilic protective layer (also known in the art as a "seal", "sublayer", or "interlayer") to increase its hydrophilicity before one or more imageable layer formulations are applied. The hydrophilic protective layer can be applied by immersing the web in the post-treatment solution or by spraying the solution onto the web (with optional recovery tank, filter, and fluid delivery system). A suitable interlayer may also ensure that during development, the soluble regions of the imageable layer are easily removed from the substrate, leaving no residue and providing clean hydrophilic backgrounds. The hydrophilic interlayer can also protect the aluminum oxide layer against corrosion during development with highly alkaline developers and from dye penetration from the imageable layer.

Other hydrophilic interlayers are prepared from formulations including poly(vinyl phosphonic acid) (PVPA), vinyl phosphonic acid/acrylic acid (VPA/AA) copolymers, and poly(acrylic acid) (PAA) as described for example in U.S. Pat. No. 4,153,461 (Berghauser et al.) and EP 0 537 633B1 (Elsaesser et al.). U.S. Pat. No. 6,218,075 (Kimura et al.) describes the treatment of metal substrates with various compositions of poly(vinyl phosphonic acid).

U.S. Pat. No. 4,427,765 (Mohr et al.) describes the use of a water-soluble organic polymer having acidic functional groups (such as phosphorous or sulfonic acid groups) with a salt of a divalent metal cation. Various organic polymers and metal cations are described that are believed to form a complex of polymer and metal cation. U.S. Pat. No. 5,314,787 (Elsaesser et al.) describes the treatment of aluminum substrates with a hydrophilic polymer solution followed by treatment with a solution containing divalent or polyvalent metal cations.

In addition, U.S. Pat. No. 7,214,468 (Takahashi et al.) describes the use of flexible supports having a hydrophilic layer comprised of metal oxide sols. Reactive functional groups have also been added to aluminum and polymer supports as described in U.S. Pat. No. 5,807,659 (Nishimiya et al.) and EP Publication 1,495,866 A1 (Mitsumoto et al.). An intermediate layer comprising a polymer derived from a phosphate-substituted methacrylate is described in EP Publication 1,788,429 (Loccufier et al.).

A hydrophilic layer on the metal support of lithographic elements described in EP Publication 1,791,699 (Fiebag et al.) contains a phosphono-substituted siloxane. EP Publication 1,787,166 (Strehmel et al.) describes the use of phosphate-containing compounds in interlayers.

U.S. Pat. No. 7,049,048 (Hunter et al.) describes an interlayer material on an aluminum support in lithographic elements that includes a copolymer having acidic groups and silyl groups that are substituted with three alkoxy or phenoxy groups.

PROBLEM TO BE SOLVED

While there are many interlayer materials described for substrates in lithographic elements, the adhesion between the metal or polymeric substrate material and overlying imageable layers can still be improved. This problem is especially evident with sulfuric acid-anodized aluminum substrates to which are adhered negative-working imageable layer formulations designed for on-press development.

Thus, there remains a need for further improved hydrophilic substrates having hydrophilic interlayer compositions that provide desired adhesion to overlying imageable layers even under humid conditions.

SUMMARY OF THE INVENTION

The present invention provides a substrate comprising a metal or polymer support having thereon an interlayer comprising a trialkoxysilyl polyethylene glycol acrylate having the following Structure (I):

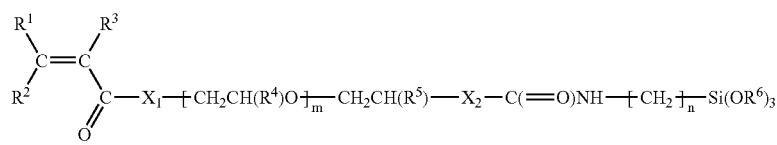

wherein $R^1$ and $R^2$ are independently hydrogen or $C_1$ to $C_6$ alkyl, $C_1$ to $C_6$ alkenyl, $C_1$ to $C_6$ alkoxy, $C_1$ to $C_6$ acyl, $C_1$ to $C_6$ acyloxy, phenyl, halo, or cyano groups, or $R^1$ and $R^2$ together can form a cyclic group, $R^3$ is hydrogen, or a $C_1$ to $C_6$ alkyl, phenyl, halo, or cyano group, $R^4$ and $R^5$ are independently hydrogen or methyl groups, $R^6$ is hydrogen or a $C_1$ to $C_{12}$ alkyl group, $X_1$ is —O— or —NR— wherein R is hydrogen or an alkyl or aryl group, $X_2$ is —NR'— wherein R' is hydrogen or an alkyl or aryl group, m is an integer of from 15 to 200, and n is an integer of from 1 to 12.

This invention also provides a negative-working imageable element comprising a substrate having disposed thereon an imageable layer that becomes more insoluble in a processing solution after exposure to imaging radiation (such as infrared imaging radiation), and the imageable element further comprises, between the substrate and the imageable layer:

an interlayer comprising the trialkoxysilyl polyethylene glycol acrylate represented by Structure (I) identified above.

In some embodiments, the imageable elements of this invention are negative-working, on-press developable imageable elements comprising the substrate of this invention that has thereon an imageable layer comprising:

a radically polymerizable component, an initiator composition capable of generating free radicals sufficient to initiate polymerization of free radically polymerizable groups upon exposure to imaging infrared radiation, a primary polymeric binder that has a backbone to which are attached pendant poly(alkylene oxide) side chains, cyano groups, or both, and is optionally present in the form of discrete particles, and an infrared radiation absorbing compound, the imageable element further comprising between the substrate and the imageable layer, an interlayer comprising a trialkoxysilyl polyethylene glycol acrylate defined by Structure (I) described herein.

This invention also provides a method comprising:

A) imagewise exposing the imageable element of this invention using infrared imaging radiation to produce exposed and non-exposed regions, and B) with or without a post-exposure baking step, developing the imagewise exposed element to remove predominantly only the non-exposed regions.

Some of the imageable elements of this invention are on-press developable negative-working printing plate precursors that are developed only in the presence of a fountain solution, lithographic printing ink, or a combination thereof.

In some of the specific negative-working imageable elements and methods of this invention, the imageable elements comprise an infrared radiation absorbing dye, a primary polymeric binder that is in the form of discrete particles having an average particle size of from about 10 to about 500 nm, and is present in the imageable layer in an amount of at least 10% and up to 90% based on the total imageable layer dry weight, the initiator composition comprises an iodonium compound, or the combination of a diaryliodonium cation and a boron-containing anion, wherein the diaryliodonium cation is represented by the following Structure (IB):

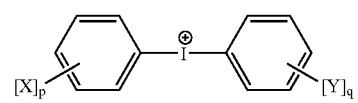

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, provided that either p or q is at least 1, and the boron-containing anion is represented by the following Structure ($IB_Z$):

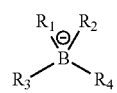

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom, such rings having up to 7 carbon, nitrogen, oxygen, or nitrogen atoms, in the interlayer, the trialkoxysilyl polyethylene glycol acrylate having Structure (I) has $R^1$ and $R^2$ that are independently hydrogen or a $C_1$ to $C_4$ alkyl group or phenyl group, $R^3$ that is hydrogen or a $C_1$ to $C_3$ alkyl or phenyl group, $R^6$ that is a $C_1$ to $C_4$ alkyl group, $X_1$ is —O— or —NH—, $X_2$ that is —NH— or —NCH$_3$—, m that is an integer of from 20 to 70, and n that is an integer of from 2 to 6, and a substrate that comprises a sulfuric acid-anodized aluminum-containing support upon which the interlayer is disposed.

The method of this invention can be used to provide an on-press developed lithographic printing plate.

The interlayer composition used in the practice of this invention provides hydrophilicity to the substrate for various uses and particularly for lithographic elements that include an imageable layer disposed thereon. The interlayer provides improved adhesion to overlying imageable layer(s) without adversely affecting other desired properties in the element. It is believed that the compound shown in Structure (I) provides improved developer solubility and layer stability because of the presence of the urea linkage.

DETAILED DESCRIPTION OF THE INVENTION

Definitions

Unless the context indicates otherwise, when used herein, the terms "substrate", "imageable element", "negative-working lithographic printing plate precursor", and "printing plate precursor" are meant to be references to embodiments of the present invention.

In addition, unless the context indicates otherwise, the various components described herein such as "primary polymeric binder", "free radically polymerizable component", "infrared radiation absorbing compound", trialkoxysilyl polyethylene glycol" of Structure (I), "iodonium cation", "boron-containing anion", "secondary polymeric binder", "phosphate (meth)acrylate", and similar terms also refer to mixtures of such components. Thus, the use of the articles "a", "an", and "the" is not necessarily meant to refer to only a single component.

By the term "interlayer" we intend a layer that is disposed on the metal or polymer support (described below) in various ways. The art may also consider this interlayer as a "sublayer" and we mean those terms to be the same thing in the practice of this invention.

Moreover, unless otherwise indicated, percentages refer to percents by dry weight.

For clarification of definitions for any terms relating to polymers, reference should be made to "Glossary of Basic Terms in Polymer Science" as published by the International Union of Pure and Applied Chemistry ("IUPAC"), Pure Appl. Chem. 68, 2287-2311 (1996). However, any definitions explicitly set forth herein should be regarded as controlling.

"Graft" polymer or copolymer refers to a polymer having a side chain that has a molecular weight of at least 200.

The term "polymer" refers to high and low molecular weight polymers including oligomers and includes homopolymers and copolymers.

The term "copolymer" refers to polymers that are derived from two or more different monomers.

The term "backbone" refers to the chain of atoms (carbon or heteroatoms) in a polymer to which a plurality of pendant groups are attached. One example of such a backbone is an "all carbon" backbone obtained from the polymerization of one or more ethylenically unsaturated polymerizable monomers. However, other backbones can include heteroatoms wherein the polymer is formed by a condensation reaction or some other means.

Substrate

The interlayer composition used in the practice of this invention comprises a trialkoxysilyl polyethylene glycol acrylate having the following Structure (I):

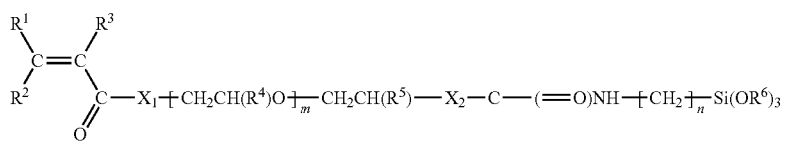

(I)

wherein $R^1$ and $R^2$ are independently hydrogen or $C_1$ to $C_6$ alkyl (substituted or unsubstituted, linear or branched), $C_1$ to $C_6$ alkenyl (substituted or unsubstituted, linear or branched), $C_1$ to $C_6$ alkoxy (substituted or unsubstituted, linear or branched), $C_1$ to $C_6$ acyl (substituted or unsubstituted, linear or branched), $C_1$ to $C_6$ acyloxy (substituted or unsubstituted, linear or branched), substituted or unsubstituted phenyl, halo, or cyano groups, or $R^1$ and $R^2$ together can form a substituted or unsubstituted cyclic group, for example having 3 to 7 atoms in the ring. In some embodiments, $R^1$ and $R^2$ are independently hydrogen or a $C_1$ to $C_4$ alkyl group (substituted or unsubstituted) or a substituted or unsubstituted phenyl group. More specifically, $R^1$ and $R^2$ can be independently hydrogen or substituted or unsubstituted methyl groups.

$R^3$ is hydrogen, or a $C_1$ to $C_6$ alkyl (substituted or unsubstituted, linear or branched), substituted or unsubstituted phenyl, halo, or cyano group. For example, $R^3$ can be hydrogen or a $C_1$ to $C_3$ alkyl (substituted or unsubstituted) or a substituted or unsubstituted phenyl group. More typically, $R^3$ is hydrogen or a substituted or unsubstituted methyl group.

$R^4$ and $R^5$ are independently hydrogen or substituted or unsubstituted methyl groups.

$R^6$ is hydrogen or a $C_1$ to $C_{12}$ alkyl group (substituted or unsubstituted, linear or branched, including benzyl groups). $R^6$ is a $C_1$ to $C_4$ alkyl group (substituted or unsubstituted), such as a substituted or unsubstituted methyl or ethyl group.

$X_1$ is —O— or —NR— wherein R is hydrogen or a substituted or unsubstituted alkyl having 1 to 6 carbon atoms or a substituted or unsubstituted aryl group having 6 or 10 carbon atoms in the ring. For example, $X_1$ can be —O— or —NH—, or more typically, —NH—.

$X_2$ is —NR'— wherein R' is hydrogen or a substituted or unsubstituted alkyl group having 1 to 6 carbon atoms or a substituted or unsubstituted aryl group having 6 or 10 carbon atoms in the ring. For example, $X_2$ can be —NH— or —NCH$_3$—, or more typically, —NH—.

In Structure (I), m is an integer of from 15 to 200 or typically from 20 to 70 or from about 25 to 60, and n is an integer of from 1 to 12 or from 2 to 6, or from 2 to 4.

In one specific embodiment, the interlayer composition comprises a reaction product of Jeffamine (meth)acrylamide with 3-isocyanatopropyl triethoxysilane. Other useful interlayer compositions include surfactants such as that present in the commercial product Masurf® 1520 that can be obtained from Mason Chemical Company.

The dry interlayer coverage on the metal or polymeric support (described below) is generally at least 0.0001 and up to 0.1 g/m$^2$ and typically from about 0.007 to about 0.07 g/m$^2$. The coverage may be lower if the interlayer formulation is applied to the support by a dip and rinse process and it may be higher if the interlayer formulation is applied to the support by using a slot coater (for example from about 0.03 to about 0.06 g/m$^2$).

Thus, the substrate has a hydrophilic surface, or at least a surface that is more hydrophilic than the applied imageable layer compositions on the imaging side. The substrate comprises a support that can be composed of any polymeric or metal support material that is conventionally used to prepare imageable elements such as lithographic printing plates. It is usually in the form of a sheet, film, or foil (or web), and is strong, stable, and flexible and resistant to dimensional change under conditions of use so that color records will register a full-color image. Typically, the support can be any self-supporting material including polymeric films (such as polyester, polyethylene, polycarbonate, cellulose ester polymer, and polystyrene films), glass, ceramics, metal sheets or foils, or stiff papers (including resin-coated and metallized papers), or a lamination of any of these materials (such as a lamination of an aluminum foil onto a polyester film). Metal supports include sheets or foils of aluminum, copper, zinc, titanium, and alloys thereof.

Both polymeric film and metal supports are modified on one or both flat surfaces with the interlayer composition described above.

One useful substrate is composed of an aluminum-containing support that may be treated using techniques known in the art, including roughening of some type by physical (mechanical) graining, electrochemical graining, or chemical graining, usually followed by acid anodizing. The aluminum support can be roughened by physical or electrochemical graining and then anodized using phosphoric or sulfuric acid and conventional procedures. A useful substrate is an electrochemically grained and sulfuric acid anodized aluminum support that has been treated or coated with the interlayer composition described above.

Sulfuric acid anodization of the aluminum support generally provides an oxide weight (coverage) on the surface of from about 1.5 to about 5 g/m$^2$ and more typically from about 3 to about 4.3 g/m$^2$. Phosphoric acid anodization generally provides an oxide weight on the surface of from about 1.5 to about 5 g/m$^2$ and more typically from about 1 to about 3 g/m$^2$.

In some embodiments, the surface of the aluminum-containing support can be electrochemically grained using the procedure and chemistry described in copending and commonly assigned U.S. Ser. No. 11/478,266 (filed Jun. 29, 2006 by Hunter, Hunter, Motoc, Doescher, Sroka, Huang, and Blum) that is also incorporated herein. In these procedures, the roughened aluminum-containing support is subjected to alternating current preferably in an electrolytic solution containing a suitable strong acid such as hydrochloric, nitric acid, or mixtures thereof. The acidic concentration of the electrolytic solution is generally from about 0.4% and typically from about 0.7% to about 2% for hydrochloric acid, or from about 0.2% and typically from about 0.4% to about 2.5% for nitric acid. Optional additives can be present in the electrolytic solution as corrosion inhibitors or stabilizers including but not limited to, metal nitrates and chlorides (such as aluminum nitrate and aluminum chloride), monoamines, diamines, aldehydes, phosphoric acid, chromic acid, boric acid, lactic acid, acetic acid, and oxalic acid.

The thickness of the substrate can be varied but should be sufficient to sustain the wear from printing and thin enough to wrap around a printing form. Useful embodiments include a treated aluminum foil having a thickness of at least 100 µm and up to and including 700 µm.

In general, the supports used to prepare as substrates have the desired tensile strength, elasticity, crystallinity, conductivity, and other physical properties that are conventional in the lithographic art, which properties can be achieved using known treatments such as heat treatment, cold or hot fabrication processes, or other methods conventional in the art of aluminum alloy fabrication for lithographic substrate preparation.

The substrates can be prepared as continuous webs or coiled strips to provide substrates as continuous webs that can be cut into desired sheets at a later time.

The backside (non-imaging side) of the substrate may be coated with antistatic agents and/or slipping layers or a matte layer to improve handling and "feel" of the imageable element.

The substrate can also be a cylindrical surface having the radiation-sensitive composition applied thereon, and thus be an integral part of the printing press. The use of such imaging cylinders is described for example in U.S. Pat. No. 5,713,287 (Gelbart).

The interlayer composition can be applied to the substrate as a solution or dispersion in a coating liquid using any suitable equipment and procedure. For example, the interlayer can be formed by dipping the support into a 0.01-10% (weight) warm to hot (30 to 90° C.) aqueous solution of the interlayer composition for 10 to 30 seconds. Alternatively, the interlayer composition can be applied by conventional methods such as spin coating, knife coating, gravure coating, die coating, slot coating, bar coating, wire rod coating, roller coating, dipping, or extrusion hopper coating. The composition can also be applied by spraying onto a suitable support (such as an on-press printing cylinder).

Useful solvents for dissolving the compounds of Structure (I) to form an interlayer composition include water, alcohols, ketones, and water/alcohol mixtures. The resulting solutions can also include fluorosurfactants. Specific interlayer formulations and a method of application are described in the Examples below, but one skilled in the art would readily know how to adapt known processes to apply the interlayer formulations in manufacturing.

Imageable Elements

The present invention can be used in photomask lithography, chemically amplified resists, imprint lithography, microelectronic and microoptical devices, printed circuit boards, and particularly lithographic printing plate precursors.

In particular, the present invention is directed to negative-working imageable elements in which a single infrared radiation-sensitive imageable layer is disposed on and adhered to the substrate of this invention. Thus, upon exposure to imaging radiation, the exposed regions become less soluble in developing or processing solutions while the non-exposed regions are removable in those solutions. The remainder of this disclosure will be directed to the negative-working embodiments of the invention and will describe their various layers and components.

Imageable Layers

The IR radiation-sensitive composition (and imageable layer) includes one or more free radically polymerizable components, each of which contains one or more free radically polymerizable groups that can be polymerized using free radical initiation. For example, such free radically polymerizable components can contain one or more free radical polymerizable monomers or oligomers having one or more addition polymerizable ethylenically unsaturated groups, crosslinkable ethylenically unsaturated groups, ring-opening polymerizable groups, azido groups, aryldiazonium salt groups, aryldiazosulfonate groups, or a combination thereof. Similarly, crosslinkable polymers having such free radically polymerizable groups can also be used.

Suitable ethylenically unsaturated components that can be polymerized or crosslinked include ethylenically unsaturated polymerizable monomers that have one or more of the polymerizable groups, including unsaturated esters of alcohols, such as acrylate and methacrylate esters of polyols. Oligomers or prepolymers, such as urethane acrylates and methacrylates, epoxide acrylates and methacrylates, polyester acrylates and methacrylates, polyether acrylates and methacrylates, and unsaturated polyester resins can also be used. In some embodiments, the free radically polymerizable component comprises carboxy groups.

Useful free radically polymerizable components include free-radical polymerizable monomers or oligomers that comprise addition polymerizable ethylenically unsaturated groups including multiple acrylate and methacrylate groups and combinations thereof, or free-radical crosslinkable polymers. Free radically polymerizable compounds include those derived from urea urethane(meth)acrylates or urethane(meth) acrylates having multiple polymerizable groups. For example, a free radically polymerizable component can be prepared by reacting DESMODUR® N100 aliphatic polyisocyanate resin based on hexamethylene diisocyanate (Bayer Corp., Milford, Conn.) with hydroxyethyl acrylate and pentaerythritol triacrylate. Useful free radically polymerizable compounds include NK Ester A-DPH (dipentaerythritol hexaacrylate) that is available from Kowa American, and Sartomer 399 (dipentaerythritol pentaacrylate), Sartomer 355 (di-trimethylolpropane tetraacrylate), Sartomer 295 (pentaerythritol tetraacrylate), and Sartomer 415 [ethoxylated (20)trimethylolpropane triacrylate] that are available from Sartomer Company, Inc.

Numerous other free radically polymerizable components are known to those skilled in the art and are described in considerable literature including *Photoreactive Polymers: The Science and Technology of Resists*, A Reiser, Wiley, New York, 1989, pp. 102-177, by B. M. Monroe in *Radiation Curing: Science and Technology*, S. P. Pappas, Ed., Plenum, New York, 1992, pp. 399-440, and in "Polymer Imaging" by A. B. Cohen and P. Walker, in *Imaging Processes and Material*, J. M. Sturge et al. (Eds.), Van Nostrand Reinhold, New York, 1989, pp. 226-262. For example, useful free radically polymerizable components are also described in EP 1,182, 033A1 (noted above), beginning with paragraph [0170], and in U.S. Pat. Nos. 6,309,792 (Hauck et al.), 6,569,603 (Furukawa), and 6,893,797 (Munnelly et al.).

Other useful free radically polymerizable components include those described in copending and commonly assigned U.S. Ser. No. 11/949,810 (filed Dec. 4, 2007 by Bauman, Dwars, Strehmel, Simpson, Savariar-Hauck, and Hauck) that include 1H-tetrazole groups. This copending application is incorporated herein by reference.

In addition to, or in place of the free radically polymerizable components described above, the IR radiation-sensitive composition may include polymeric materials that include side chains attached to the backbone, which side chains include one or more free radically polymerizable groups (such as ethylenically unsaturated groups) that can be polymerized (crosslinked) in response to free radicals produced by the initiator composition (described below). There may be at least two of these side chains per molecule. The free radically polymerizable groups (or ethylenically unsaturated groups) can be part of aliphatic or aromatic acrylate side chains attached to the polymeric backbone. Generally, there are at least 2 and up to 20 such groups per molecule, or typically from 2 to 10 such groups per molecule.

Such free radically polymerizable polymers can also comprise hydrophilic groups including but not limited to, carboxy, sulfo, or phospho groups, either attached directly to the backbone or attached as part of side chains other than the free radically polymerizable side chains.

Useful commercial products that comprise polymers that can be used in this manner include Bayhydrol® UV VP LS 2280, Bayhydrol® UV VP LS 2282, Bayhydrol® UV VP LS 2317, Bayhydrol® UV VP LS 2348, and Bayhydrol® UV XP 2420, that are all available from Bayer MaterialScience, as well as Laromer™ LR 8949, Laromer™ LR 8983, and Laromer™ LR 9005, that are all available from BASF.

The one or more free radically polymerizable components (monomeric, oligomeric, or polymeric) can be present in the imageable layer in an amount of at least 10 weight % and up to 80 weight %, and typically from about 20 to about 50 weight %, based on the total dry weight of the imageable layer. The weight ratio of the free radically polymerizable component to the total polymeric binders (described below) is generally from about 5:95 to about 95:5, and typically from about 10:90 to about 90:10, or even from about 30:70 to about 70:30.

The IR radiation-sensitive composition also includes an initiator composition that includes one or more initiators that are capable of generating free radicals sufficient to initiate polymerization of all the various free radically polymerizable components upon exposure of the composition to imaging radiation. The initiator composition is generally responsive to infrared imaging radiation corresponding to the spectral range of at least 700 nm and up to and including 1400 nm (typically from about 750 to about 1250 nm). Initiator compositions are used that are appropriate for the desired imaging wavelength(s).

The initiator composition can include one or more iodonium cations and one or more boron-containing anions at a molar ratio of at least 1.2:1 and up to 3.0:1, and typically from about 1.4:1 to about 2.5:1 or from about 1.4:1 to about 2.0:1.

Useful iodonium cations are well known in the art including but not limited to, U.S. Patent Application Publication 2002/0068241 (Oohashi et al.), WO 2004/101280 (Munnelly et al.), and U.S. Pat. Nos. 5,086,086 (Brown-Wensley et al.), 5,965,319 (Kobayashi), and 6,051,366 (Baumann et al.). For example, a useful iodonium cation includes a positively charged iodonium, (4-methylphenyl)[4-(2-methylpropyl) phenyl]- moiety and a suitable negatively charged counterion. A representative example of such an iodonium salt is available as Irgacure® 250 from Ciba Specialty Chemicals (Tarrytown, N.Y.) that is (4-methylphenyl)[4-(2-methylpropyl) phenyl]iodonium hexafluorophosphate and is supplied in a 75% propylene carbonate solution.

The iodonium cations can be paired with a suitable number of negatively-charged counterions such as halides, hexafluorophosphate, thiosulfate, hexafluoroantimonate, tetrafluoroborate, sulfonates, hydroxide, perchlorate, others readily apparent to one skilled in the art.

Thus, the iodonium cations can be supplied as part of one or more iodonium salts, and as described below, the iodonium cations can be supplied as iodonium borates also containing suitable boron-containing anions. For example, the iodonium cations and the boron-containing anions can be supplied as part of salts that are combinations of Structures (IB) and (IBz) described below, or both the iodonium cations and boron-containing anions can be supplied from different sources. However, if they are supplied at least from the iodonium borate salts, since such salts generally supply about a 1:1 molar ratio of iodonium cations to boron-containing anions, additional iodonium cations must be supplied from other sources, for example, from iodonium salts described above.

For example, the imageable layer (and element) can comprise a mixture of iodonium cations, some of which are derived from an iodonium borate (described below) and others of which are derived from a non-boron-containing iodonium salt (described above). When both types of iodonium salts are present, the molar ratio of iodonium derived from the iodonium borate to the iodonium derived from the non-boron-containing iodonium salt can be up to 5:1 and typically up to 2.5:1.

One class of useful iodonium cations include diaryliodonium cations that are represented by the following Structure (IB):

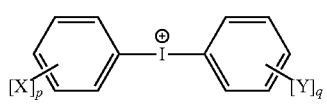

wherein X and Y are independently halo groups (for example, fluoro, chloro, or bromo), substituted or unsubstituted alkyl groups having 1 to 20 carbon atoms (for example, methyl, chloromethyl, ethyl, 2-methoxyethyl, n-propyl, isopropyl, isobutyl, n-butyl, t-butyl, all branched and linear pentyl groups, 1-ethylpentyl, 4-methylpentyl, all hexyl isomers, all octyl isomers, benzyl, 4-methoxybenzyl, p-methylbenzyl, all dodecyl isomers, all icosyl isomers, and substituted or unsubstituted mono- and poly-, branched and linear haloalkyls), substituted or unsubstituted alkyloxy having 1 to 20 carbon atoms (for example, substituted or unsubstituted methoxy, ethoxy, isopropoxy, t-butoxy, (2-hydroxytetradecyl)oxy, and various other linear and branched alkyleneoxyalkoxy groups), substituted or unsubstituted aryl groups having 6 or 10 carbon atoms in the carbocyclic aromatic ring (such as substituted or unsubstituted phenyl and naphthyl groups including mono- and polyhalophenyl and naphthyl groups), or substituted or unsubstituted cycloalkyl groups having 3 to 8 carbon atoms in the ring structure (for example, substituted or unsubstituted cyclopropyl, cyclopentyl, cyclohexyl, 4-methylcyclohexyl, and cyclooctyl groups). Typically, X and Y are independently substituted or unsubstituted alkyl groups having 1 to 8 carbon atoms, alkyloxy groups having 1 to 8 carbon atoms, or cycloalkyl groups having 5 or 6 carbon atoms in the ring, and more preferably, X and Y are independently substituted or unsubstituted alkyl groups having 3 to 6 carbon atoms (and particularly branched alkyl groups having 3 to 6 carbon atoms). Thus, X and Y can be the same or different groups, the various X groups can be the same or different groups, and the various Y groups can be the same or different groups. Both "symmetric" and "asymmetric" diaryliodonium borate compounds are contemplated but the "symmetric" compounds are preferred (that is, they have the same groups on both phenyl rings).

In addition, two or more adjacent X or Y groups can be combined to form a fused carbocyclic or heterocyclic ring with the respective phenyl groups.

The X and Y groups can be in any position on the phenyl rings but typically they are at the 2- or 4-positions on either or both phenyl rings.

Despite what type of X and Y groups are present in the iodonium cation, the sum of the carbon atoms in the X and Y substituents generally is at least 6, and typically at least 8, and up to 40 carbon atoms. Thus, in some compounds, one or more X groups can comprise at least 6 carbon atoms, and Y does not exist (q is 0). Alternatively, one or more Y groups can comprise at least 6 carbon atoms, and X does not exist (p is 0). Moreover, one or more X groups can comprise less than 6 carbon atoms and one or more Y groups can comprise less than 6 carbon atoms as long as the sum of the carbon atoms in both X and Y is at least 6. Still again, there may be a total of at least 6 carbon atoms on both phenyl rings.

In Structure IB, p and q are independently 0 or integers of 1 to 5, provided that either p or q is at least 1. Typically, both p and q are at least 1, or each of p and q is 1. Thus, it is understood that the carbon atoms in the phenyl rings that are not substituted by X or Y groups have a hydrogen atom at those ring positions.

Useful boron-containing anions are organic anions having four organic groups attached to the boron atom. Such organic anions can be aliphatic, aromatic, heterocyclic, or a combination of any of these. Generally, the organic groups are substituted or unsubstituted aliphatic or carbocyclic aromatic groups. For example, useful boron-containing anions can be represented by the following Structure (IB$_Z$):

wherein $R_1$, $R_2$, $R_3$, and $R_4$ are independently substituted or unsubstituted alkyl groups having 1 to 12 carbon atoms (such as methyl, ethyl, n-propyl, isopropyl, n-butyl, isobutyl, t-butyl, all pentyl isomers, 2-methylpentyl, all hexyl isomers, 2-ethylhexyl, all octyl isomers, 2,4,4-trimethylpentyl, all nonyl isomers, all decyl isomers, all undecyl isomers, all dodecyl isomers, methoxymethyl, and benzyl) other than fluoroalkyl groups, substituted or unsubstituted carbocyclic aryl groups having 6 to 10 carbon atoms in the aromatic ring (such as phenyl, p-methylphenyl, 2,4-methoxyphenyl, naphthyl, and pentafluorophenyl groups), substituted or unsubstituted alkenyl groups having 2 to 12 carbon atoms (such as ethenyl, 2-methylethenyl, allyl, vinylbenzyl, acryloyl, and crotonotyl groups), substituted or unsubstituted alkynyl groups having 2 to 12 carbon atoms (such as ethynyl, 2-methylethynyl, and 2,3-propynyl groups), substituted or unsubstituted cycloalkyl groups having 3 to 8 carbon atoms in the ring structure (such as cyclopropyl, cyclopentyl, cyclohexyl, 4-methylcyclohexyl, and cyclooctyl groups), or substituted or unsubstituted heterocyclyl groups having 5 to 10 carbon, oxygen, sulfur, and nitrogen atoms (including both aromatic and non-aromatic groups, such as substituted or unsubstituted pyridyl, pyrimidyl, furanyl, pyrrolyl, imidazolyl, triazolyl, tetrazoylyl, indolyl, quinolinyl, oxadiazolyl, and benzoxazolyl groups). Alternatively, two or more of $R_1$, $R_2$, $R_3$, and $R_4$ can be joined together to form a heterocyclic ring with the boron atom, such rings having up to 7 carbon, nitrogen, oxygen, or nitrogen atoms. None of the $R_1$ through $R_4$ groups contains halogen atoms and particularly fluorine atoms.

Typically, $R_1$, $R_2$, $R_3$, and $R_4$ are independently substituted or unsubstituted alkyl or aryl groups as defined above, and more typically, at least 3 of $R_1$, $R_2$, $R_3$, and $R_4$ are the same or different substituted or unsubstituted aryl groups (such as substituted or unsubstituted phenyl groups). For example, all of $R_1$, $R_2$, $R_3$, and $R_4$ can be the same or different substituted or unsubstituted aryl groups, or all of the groups are the same substituted or unsubstituted phenyl group. $Z^-$ can be a tetraphenyl borate wherein the phenyl groups are substituted or unsubstituted (for example, all are unsubstituted phenyl groups).

Some representative iodonium borate compounds include but are not limited to, 4-octyloxyphenyl phenyliodonium tetraphenylborate, [4-[(2-hydroxytetradecyl)-oxy]phenyl]phenyliodonium tetraphenylborate, bis(4-t-butylphenyl)iodonium tetraphenylborate, 4-methylphenyl-4'-hexylphenyliodonium tetraphenylborate, 4-methylphenyl-4'-cyclohexylphenyliodonium tetraphenylborate, bis(t-butylphenyl)iodonium tetrakis(pentafluorophenyl)borate, 4-hexylphenyl-phenyliodonium tetraphenylborate, 4-methylphenyl-4'-cyclohexylphenyliodonium n-butyltriphenylborate, 4-cyclohexylphenyl-4'-phenyliodonium tetraphenylborate, 2-methyl-4-t-butylphenyl-4'-methylphenyliodonium tetraphenylborate, 4-methylphenyl-4'-pentylphenyliodonium tetrakis[3,5-bis(trifluoromethyl)phenyl]-borate, 4-methoxyphenyl-4'-cyclohexylphenyliodonium tetrakis (pentafluorophenyl)borate, 4-methylphenyl-4'-dodecylphenyliodonium tetrakis(4-fluorophenyl)borate, bis(dodecylphenyl)iodonium tetrakis(pentafluorophenyl)borate, and bis(4-t-butylphenyl)iodonium tetrakis(1-imidazolyl)borate. Mixtures of two or more of these compounds can also be used in the iodonium borate initiator composition.

Such diaryliodonium borate compounds can be prepared, in general, by reacting an aryl iodide with a substituted or unsubstituted arene, followed by an ion exchange with a borate anion. Details of various preparatory methods are described in U.S. Pat. No. 6,306,555 (Schulz et al.), and references cited therein, and by Crivello, *J. Polymer Sci., Part A: Polymer Chemistry*, 37, 4241-4254 (1999), both of which are incorporated herein by reference.

The boron-containing anions can also be supplied as part of infrared radiation absorbing dyes (for example, cationic dyes) as described below. Such boron-containing anions generally are defined as described above with Structure (IBz).

The iodonium cations and boron-containing anions are generally present in the imageable layer in a combined amount of at least 1% and up to and including 15%, and typically at least 4 and up to and including about 10%, based on total dry weight of the imageable layer. The optimum amount of the various initiator components may differ for various compounds and the sensitivity of the radiation-sensitive composition that is desired and would be readily apparent to one skilled in the art.

The imageable layer may also include heterocyclic mercapto compounds including mercaptotriazoles, mercaptobenzimidazoles, mercaptobenzoxazoles, mercaptobenzothiazoles, mercaptobenzoxadiazoles, mercaptotetrazoles, such as those described for example in U.S. Pat. No. 6,884,568 (Timpe et al.) in amounts of at least 0.5 and up to and including 10 weight % based on the total solids of the radiation-sensitive composition. Useful mercaptotriazoles include 3-mercapto-1,2,4-triazole, 4-methyl-3-mercapto-1,2,4-triazole, 5-mercapto-1-phenyl-1,2,4-triazole, 4-amino-3-mercapto-1,2,4,-triazole, 3-mercapto-1,5-diphenyl-1,2,4-triazole, and 5-(p-aminophenyl)-3-mercapto-1,2,4-triazole.

Some useful initiator compositions include the following combinations:

iodonium cations supplied from non-boron containing iodonium salts only and boron-containing anions separately supplied from other salts including cationic infrared dyes, iodonium cations supplied from both non-boron containing iodonium salts and iodonium borates and boron-containing anions from only the iodonium borates, or iodonium cations supplied from both non-boron containing iodonium salts and iodonium borates and boron-containing anions from both iodonium borates and other sources (such as cationic IR dyes).

The radiation-sensitive composition generally includes one or more radiation absorbing compounds such as infrared radiation absorbing compounds that absorb imaging radiation, or sensitize the composition to imaging radiation having a $\lambda_{max}$ in the IR region of the electromagnetic spectrum noted above (for example from about 700 to about 1400 nm).

The infrared radiation absorbing dye can be present in the radiation-sensitive composition in an amount generally of at least 0.5% and up to and including 10% and typically at least 1 and up to and including 10%, based on total dry weight of the imageable layer. The particular amount needed for this purpose would be readily apparent to one skilled in the art, depending upon the specific compound used.

The imageable layer also includes a primary polymeric binder that generally has a molecular weight of at least 2,000 and up to and including 1,000,000, at least 10,000 and up to and including 200,000, or at least 10,000 and up to and including 100,000.

The primary polymeric binder(s) can comprise at least 10 and up to 80 weight % (typically from about 15 to about 40 weight %), based on the total dry weight of the radiation-sensitive composition (or imageable layer). The polymeric binders may be homogenous, that is, dissolved in the coating solvent, or they may exist as discrete particles.

Useful primary polymeric binders include but are not limited to, (meth)acrylic acid and acid ester resins [such as (meth)acrylates], polyvinyl acetals, phenolic resins, polymers derived from one or more (meth)acrylates, (meth)acrylonitriles, styrene, N-substituted cyclic imides or maleic anhydrides, including those described in EP 1,182,033 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.). Copolymers of polyethylene glycol methacrylate/acrylonitrile/styrene in particulate form, dissolved copolymers of carboxyphenyl methacrylamide/-acrylonitrile/methacrylamide/N-phenyl maleimide, copolymers of polyethylene glycol methacrylate/acrylonitrile/-vinylcarbazole/styrene/methylacrylic acid, N-phenyl maleimide/methacrylamide/methacrylic acid, urethane-acrylic intermediate A (the reaction product of p-toluene sulfonyl isocyanate and hydroxyl ethyl methacrylate)/-acrylonitrile/N-phenyl maleimide, and N-methoxymethyl methacrylamide/-methacrylic acid/acrylonitrile/n-phenyl-maleimide are also useful.

In many embodiments, the imageable layer includes one or more primary polymeric binders that are present in the form of discrete particles having an average particle size of from about 10 to about 500 nm, and typically from about 150 to about 450 nm, and generally distributed uniformly within that layer. The particulate polymeric binders exist at room temperature as discrete particles, for example in an aqueous dispersion. However, the particles can also be partially coalesced or deformed, for example at temperatures used for drying coated imageable layer formulations. Even in this environment, the particulate structure is not destroyed. Such polymeric binders generally have a molecular weight ($M_n$) of at least 30,000 and typically at least 50,000 to about 100,000, or from about 60,000 to about 80,000, as determined by refractive index.

Some useful primary polymeric binders include polymeric emulsions or dispersions of polymers having pendant poly (alkylene oxide) side chains that can render the imageable elements as "on-press" developable. Such primary polymeric binders are described for example in U.S. Pat. Nos. 6,582,882 (Pappas et al.) and 6,899,994 (noted above) and U.S. Patent Application Publication 2005/0123853 (Munnelly et al.). These primary polymeric binders are present in the imageable layer as discrete particles.

Other useful primary polymeric binders have hydrophobic backbones and comprise both of the following a) and b) recurring units, or the b) recurring units alone:

a) recurring units having pendant cyano groups attached directly to the hydrophobic backbone, and b) recurring units having hydrophilic pendant groups comprising poly(alkylene oxide) segments.

These primary polymeric binders comprise poly(alkylene oxide) segments such as poly(ethylene oxide) or poly(propylene oxide) segments. These polymers can be graft copolymers having a main chain polymer and poly(alkylene oxide) pendant side chains or segments or block copolymers having blocks of (alkylene oxide)-containing recurring units and non(alkylene oxide)-containing recurring units. Both graft and block copolymers can additionally have pendant cyano groups attached directly to the hydrophobic backbone. The alkylene oxide constitutional units are generally $C_1$ to $C_6$ alkylene oxide groups, and more typically $C_1$ to $C_3$ alkylene oxide groups. The alkylene portions can be linear or branched or substituted versions thereof.

By way of example only, such recurring units can comprise pendant groups comprising cyano, cyano-substituted alkylene groups, or cyano-terminated alkylene groups. Recurring units can also be derived from ethylenically unsaturated polymerizable monomers such as acrylonitrile, methacrylonitrile, methyl cyanoacrylate, ethyl cyanoacrylate, or a combination thereof. However, cyano groups can be introduced into the polymer by other conventional means. Examples of such cyano-containing polymeric binders are described for example in U.S. Patent Application Publication 2005/003285 (Hayashi et al.).

Also by way of example, such primary polymeric binders can be formed by polymerization of a combination or mixture of suitable ethylenically unsaturated polymerizable monomers or macromers, such as:

A) acrylonitrile, methacrylonitrile, or a combination thereof,

B) poly(alkylene oxide) esters of acrylic acid or methacrylic acid, such as poly(ethylene glycol) methyl ether acrylate, poly(ethylene glycol) methyl ether methacrylate, or a combination thereof, and C) optionally, monomers such as acrylic acid, methacrylic acid, styrene, hydroxystyrene, acrylate esters, methacrylate esters (such as methyl methacrylate and benzyl methacrylate), acrylamide, methacrylamide, or a combination of such monomers.

The amount of the poly(alkylene oxide) segments in such primary polymeric binders is from about 0.5 to about 60 weight % and typically from about 2 to about 50 weight %. The amount of (alkylene oxide) segments in the block copolymers is generally from about 5 to about 60 weight % and typically from about 10 to about 50 weight %. It is also likely that the primary polymeric binders having poly(alkylene oxide) side chains are present in the form of discrete particles.

The primary polymeric binder is generally present in the radiation-sensitive composition in an amount of at least 10% and up to 90%, and typically from about 10 to about 70%, based on the total imageable layer dry weight. These binders may comprise up to 100% of the dry weight of all polymeric binders (primary polymeric binders plus any secondary polymeric binders).

Additional polymeric binders ("secondary" polymeric binders) may also be used in the imageable layer in addition to the primary polymeric binders. Such polymeric binders can be any of those known in the art for use in negative-working radiation-sensitive compositions other than those mentioned above. The secondary polymeric binder(s) may be present in an amount of from about 1.5 to about 70 weight % and typically from about 1.5 to about 40%, based on the dry coated weight of the imageable layer, and it may comprise from about 30 to about 60 weight % of the dry weight of all polymeric binders.

The secondary polymeric binders can also be particulate polymers that have a backbone comprising multiple (at least two) urethane moieties. Such polymeric binders generally have a molecular weight ($M_n$) of at least 2,000 and typically at least 100,000 to about 500,000, or from about 100,000 to about 300,000, as determined by dynamic light scattering. These polymeric binders generally are present in the imageable layer in particulate form, meaning that they exist at room temperature as discrete particles, for example in an aqueous dispersion. However, the particles can also be partially coalesced or deformed, for example at temperatures used for drying coated imageable layer formulations. Even in this environment, the particulate structure is not destroyed. In most embodiments, the average particle size of these polymeric binders is from about 10 to about 300 nm and typically the average particle size is from about 30 to about 150 nm. The particulate secondary polymeric binder is generally obtained commercially and used as an aqueous dispersion having at least 20% and up to 50% solids. It is possible that these polymeric binders are at least partially crosslinked among urethane moieties in the same or different molecules, which crosslinking could have occurred during polymer manufacture. This still leaves the free radically polymerizable groups available for reaction during imaging.

The secondary polymeric binders may be homogenous, that is, dissolved in the coating solvent, or may exist as discrete particles. Such secondary polymeric binders include but are not limited to, (meth)acrylic acid and acid ester resins [such as (meth)acrylates], polyvinyl acetals, phenolic resins, polymers derived from styrene, N-substituted cyclic imides or maleic anhydrides, such as those described in EP 1,182, 033A1 (Fujimaki et al.) and U.S. Pat. Nos. 6,309,792 (Hauck et al.), 6,352,812 (Shimazu et al.), 6,569,603 (Furukawa et al.), and 6,893,797 (Munnelly et al.). Also useful are the vinyl carbazole polymers described in U.S. Pat. No. 7,175,949 (Tao et al.), and the polymers having pendant vinyl groups as described in U.S. Pat. No. 7,279,255 (Tao et al.), both incorporated herein by reference. Copolymers of polyethylene glycol methacrylate/acrylonitrile/styrene in particulate form, dissolved copolymers derived from carboxyphenyl methacrylamide/acrylonitrile/methacrylamide/N-phenyl maleimide, copolymers derived from polyethylene glycol methacrylate/acrylonitrile/vinyl carbazole/styrene/methacrylic acid, copolymers derived from N-phenyl maleimide/methacrylamide/methacrylic acid, copolymers derived from urethane-acrylic intermediate A (the reaction product of p-toluene sulfonyl isocyanate and hydroxyl ethyl methacrylate)/ acrylonitrile/N-phenyl maleimide, and copolymers derived from N-methoxymethyl methacrylamide/methacrylic acid/acrylonitrile/n-phenylmaleimide are useful.

Additional useful secondary polymeric binders are particulate poly(urethane-acrylic) hybrids that are distributed (usually uniformly) throughout the imageable layer. Each of these hybrids has a molecular weight of from about 50,000 to about 500,000 and the particles have an average particle size of from about 10 to about 10,000 nm (preferably from about 30 to about 500 nm and more preferably from about 30 to about 150 nm). These hybrids can be either "aromatic" or "aliphatic" in nature depending upon the specific reactants used in their manufacture. Blends of particles of two or more poly(urethane-acrylic) hybrids can also be used. Some poly(urethane-acrylic) hybrids are commercially available in dispersions from Air Products and Chemicals, Inc. (Allentown, Pa.), for example, as the Hybridur® 540, 560, 570, 580, 870, 878, 880 polymer dispersions of poly(urethane-acrylic) hybrid particles. These dispersions generally include at least 30% solids of the poly(urethane-acrylic) hybrid particles in a suitable aqueous medium that may also include commercial surfactants, anti-foaming agents, dispersing agents, anti-corrosive agents, and optionally pigments and water-miscible organic solvents.

The imageable layer can also include a spirolactone or spirolactam colorant precursor. Such compounds are generally colorless or weakly colored until the presence of an acid causes the ring to open providing a colored species, or more intensely colored species.

For example, useful spirolactone and spirolactam colorant precursors include compounds represented by the following Structure (CF):

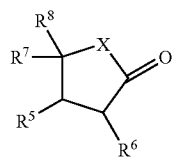

(CF)

wherein X is —O— or —NH—, $R^5$ and $R^6$ together form a carbocyclic or heterocyclic fused ring. The carbocyclic fused ring can be saturated or unsaturated and is typically 5 to 10 carbon atoms in size. Typically, 6-membered benzene fused rings are present. These rings can be substituted or unsubstituted.

$R^7$ and $R^8$ are independently substituted or unsubstituted carbocyclic groups that are either saturated (aryl groups) or unsaturated (cycloalkyl groups). Typically, they are substituted or unsubstituted aryl groups having 6 or 10 carbon atoms in the ring. $R^7$ and $R^8$ can also be independently 5- to 10-membered, substituted or unsubstituted heterocyclic groups (such as pyrrole and indole rings). Alternatively, $R^7$ and $R^8$ together can form a substituted or unsubstituted carbocyclic or heterocyclic ring as previously defined.

More useful colorant precursors can be represented by the following Structure (CF-1):

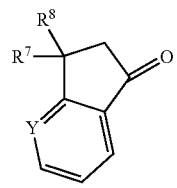

wherein Y is a nitrogen atom or methine group and $R^7$ and $R^8$ are as described above. Compounds wherein Y is a methine group are particularly useful.

Examples of useful colorant precursors include but are not limited to, Crystal Violet Lactone, Malachite Green Lactone, 3-(N,N-diethylamino)-6-chloro-7-(β-ethoxyethylamino)fluoran, 3-(N,N,N-triethylamino)-6-methyl-7-anilinofluoran, 3-(N,N-diethylamino)-7-chloro-7-o-chlorofluoran, 2-(N-phenyl-N-methylamino)-6-(N-p-tolyl-N-ethyl)aminofluoran, 2-anilino-3-methyl-6-(N-ethyl-p-toluidino)fluoran, 3,6-dimethoxyfluoran, 3-(N,N-diethylamino)-5-methyl-7-(N,N-dibenzylamino)fluoran, 3-(N-cyclohexyl-N-methylamino)-6-methyl-7-anilinofluoran, 3-(N,N-diethylamino)-6-methyl-7-anilinofluoran, 3-(N,N-diethylamino)-6-methyl-7-xylidinofluoran, 3-(N,N-diethylamino)-6-methyl-7-chlorofluoran, 3-(N,N-diethylamino)-6-methoxy-7-chlorofluoran, 3-(N,N-diethylamino)-7-(4-chloroanilino)fluoran, 3-(N,N-diethylamio)-7-chlorofluoran, 3-(N,N-diethylamino)-7-benzylaminofluoran, 3-(N,N-diethylamino)-7,8-benzofluoran, 3-(N,N-dibutylamino)-6-methyl-7-anilinofluoran, 3-(N,N-dibutylamino)-6-methyl-7-xylidinofluoran, 3-piperidino-6-methyl-7-anilinofluoran, 3-pyrrolidino-6-methyl-7-anilinofluoran, 3,3-bis(1-ethyl-2-methylindol-3-yl)phthalide, 3,3-bis((1-n-butyl-2-methylindol-3-yl)phthalide, 3,3-bis(p-dimethylaminophenyl)-6-dimethylaminophthalide, 3-(4-diethylamino-2-ethoxyphenyl)-3-(1-ethyl-2-methylindol-3-yl)-4-azaphthalide, and 3-(4-diethylaminophenyl)-3-(1-ethyl-2-methylindol-3-yl) phthalide.

Some specific useful colorant precursors are represented by the following structures:

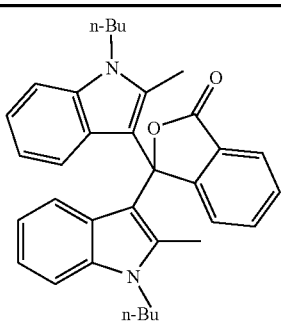

Red-40

-continued

Blue-63 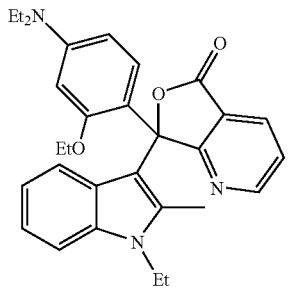

GN-2 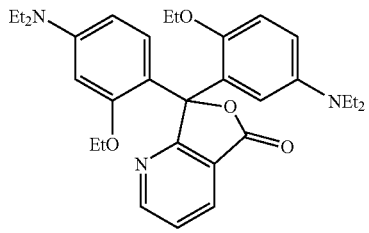

Black-15 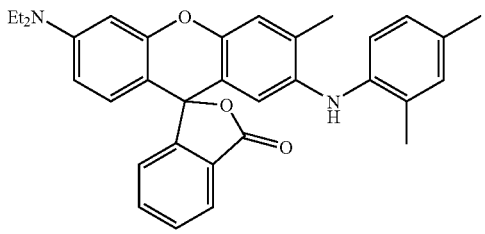

ODB-2 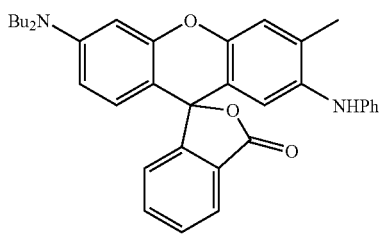

ODB-4 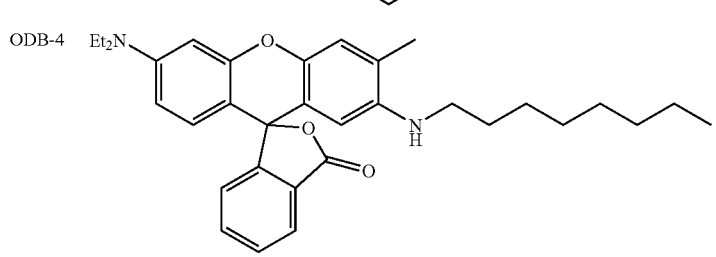

The colorant precursor described above can be present in an amount of at least 1 and up to 10 weight %, and typically from about 3 to about 6 weight %, based on the total dry imageable layer weight.

The radiation-sensitive composition (imageable layer) can further comprise one or more phosphate(meth)acrylates, each of which has a molecular weight generally greater than 200 and typically at least 300 and up to and including 1000. By "phosphate(meth)acrylate" we also mean to include "phosphate methacrylates" and other derivatives having substituents on the vinyl group in the acrylate moiety. Such compounds and their use in imageable layers are described in more detail in U.S. Pat. No. 7,175,969 (Ray et al.) that is incorporated herein by reference.

Representative phosphate(meth)acrylates include but are not limited to, ethylene glycol methacrylate phosphate (available from Aldrich Chemical Co.), a phosphate of 2-hydroxyethyl methacrylate that is available as Kayamer PM-2 from Nippon Kayaku (Japan), a phosphate of a di(caprolactone modified 2-hydroxyethyl methacrylate) that is available as Kayamer PM-21 (Nippon Kayaku, Japan), and polyethylene glycol methacrylate phosphates that are available as Phosmer M, Phosmer MH, Phosmer PE, Phosmer PEH, Phosmer PP, and Phosmer PPH from Uni-Chemical Co., Ltd. (Japan).

The phosphate(meth)acrylate can be present in the radiation-sensitive composition in an amount of at least 0.5 and up to and including 20% and typically at least 0.9 and up to and including 10%, based on total dry composition weight.

The imageable layer can also include a "primary additive" that is a poly(alkylene glycol) or an ether or ester thereof that has a molecular weight of at least 200 and up to and including 4000. This primary additive can be present in an amount of at least 2 and up to and including 50 weight %, based on the total dry weight of the imageable layer. Useful primary additives include, but are not limited to, one or more of polyethylene glycol, polypropylene glycol, polyethylene glycol methyl ether, polyethylene glycol dimethyl ether, polyethylene glycol monoethyl ether, polyethylene glycol diacrylate, ethoxylated bisphenol A di(meth)acrylate, and polyethylene glycol mono methacrylate. Also useful are Sartomer SR9036 (ethoxylated (30) bisphenol A dimethacrylate), CD9038 (ethoxylated (30) bisphenol A diacrylate), SR399 (dipentaerythritol pentaacrylate), and Sartomer SR494 (ethoxylated (5) pentaerythritol tetraacrylate), and similar compounds all of which that can be obtained from Sartomer Company, Inc. In some embodiments, the primary additive may be "non-reactive" meaning that it does not contain polymerizable vinyl groups.

The imageable layer can also include a "secondary additive" that is a poly(vinyl alcohol), a poly(vinyl pyrrolidone), poly(vinyl imidazole), or polyester in an amount of up to and including 20 weight % based on the total dry weight of the imageable layer.

Additional additives to the imageable layer include color developers or acidic compounds. As color developers, we mean to include monomeric phenolic compounds, organic acids or metal salts thereof, oxybenzoic acid esters, acid clays, and other compounds described for example in U.S. Patent Application Publication 2005/0170282 (Inno et al.). Specific examples of phenolic compounds include but are not limited to, 2,4-dihydroxybenzophenone, 4,4'-isopropylidene-diephenol (Bisphenol A), p-t-butylphenol, 2,4,-dinitrophenol, 3,4-dichlorophenol, 4,4'-methylene-bis(2,6'-di-t-butylphenol), p-phenylphenol, 1,1-bis(4-hydroxyphenyl)cyclohexane, 1,1-bis(4-hydroxyphenyl)-2-ethylhexene, 2,2-bis(4-hydroxyphenyl)butane, 2,2'-methylenebis(4-t-butylphenol), 2,2'-methylenebis(α-phenyl-p-cresol)thiodiphenol, 4,4'-thiobis(6-t-butyl-m-cresol)sulfonyldiphenol, p-butylphenol-formalin condensate, and p-phenylphenol-formalin condensate. Examples of useful organic acids or salts thereof include but are not limited to, phthalic acid, phthalic anhydride, maleic acid, benzoic acid, gallic acid, o-toluic acid, p-toluic acid, salicylic, 3-t-butylsalicylic, 3,5-di-3-t-butylsalicylic acid, 5-α-methylbenzylsalicylic acid, 3,5-bis(α-methylbenzyl)salicylic acid, 3-t-octylsalicylic acid, and their zinc, lead, aluminum, magnesium, and nickel salts. Examples of the oxybenzoic acid esters include but are not limited to, ethyl p-oxybenzoate, butyl p-oxybenzoate, heptyl p-oxybenzoate, and benzyl p-oxybenzoate. Such color developers may be present in an amount of from about 0.5 to about 5 weight %, based on total imageable layer dry weight.

The imageable layer can also include a variety of optional compounds including but not limited to, dispersing agents, humectants, biocides, plasticizers, surfactants for coatability or other properties, viscosity builders, pH adjusters, drying agents, defoamers, preservatives, antioxidants, development aids, rheology modifiers or combinations thereof, or any other addenda commonly used in the lithographic art, in conventional amounts. Useful viscosity builders include hydroxypropyl cellulose, hydroxyethyl cellulose, carboxymethyl cellulose, and poly(vinyl pyrrolidones).

Imageable Elements

The imageable elements can be formed by suitable application of a radiation-sensitive composition as described above to the substrate of this invention to form an imageable layer. This substrate can be treated or coated in various ways as described below prior to application of the radiation-sensitive composition to improve hydrophilicity. Typically, there is only a single imageable layer comprising the radiation-sensitive composition.

The element can include what is conventionally known as an overcoat (such as an oxygen impermeable topcoat) applied to and disposed over the imageable layer for example, as described in WO 99/06890 (Pappas et al.). Such overcoat layers can comprise a water-soluble polymer such as a poly (vinyl alcohol), poly(vinyl pyrrolidone), poly(ethyleneimine), or poly(vinyl imidazole), copolymers of two or more of vinyl pyrrolidone, ethyleneimine, and vinyl imidazole, and mixtures of such polymers, and generally have a dry coating weight of at least 0.1 and up to and including 4 $g/m^2$ in which the water-soluble polymer(s) comprise at least 90% and up to 100% of the dry weight of the overcoat. In many embodiments, this overcoat is not present, and the imageable layer is the outermost layer of the imageable element.

The radiation-sensitive composition can be applied to the substrate as a solution or dispersion in a coating liquid using any suitable equipment and procedure, such as spin coating, knife coating, gravure coating, die coating, slot coating, bar coating, wire rod coating, roller coating, or extrusion hopper coating. The composition can also be applied by spraying onto a suitable support (such as an on-press printing cylinder). Typically, the radiation-sensitive composition is applied and dried to form an imageable layer and an overcoat formulation is applied to that layer.

Illustrative of such manufacturing methods is mixing the radically polymerizable component, primary polymeric binder, initiator composition including iodonium cation and borate anion, infrared radiation absorbing compound, and any other components of the radiation-sensitive composition in a suitable organic solvent or mixtures thereof [such as methyl ethyl ketone (2-butanone), methanol, ethanol, 1-methoxy-2-propanol, iso-propyl alcohol, acetone, γ-butyrolactone, n-propanol, tetrahydrofuran, and others readily known in the art, as well as mixtures thereof], applying the resulting solution to a substrate, and removing the solvent(s) by evaporation under suitable drying conditions. Some representative coating solvents and imageable layer formulations are described in the Examples below. After proper drying, the coating weight of the imageable layer is generally at least 0.1 and up to and including 5 $g/m^2$ or at least 0.5 and up to and including 3.5 $g/m^2$.

Layers can also be present under the imageable layer, on the substrate, to enhance developability or to act as a thermal insulating layer. The underlying layer should be soluble or at least dispersible in the processing solution and typically have a relatively low thermal conductivity coefficient.

The various layers may be applied by conventional extrusion coating methods from melt mixtures of the respective layer compositions. Typically such melt mixtures contain no volatile organic solvents.

Intermediate drying steps may be used between applications of the various layer formulations to remove solvent(s) before coating other formulations. Drying steps at conventional times and temperatures may also help in preventing the mixing of the various layers.

Once the various layers have been applied and dried on the substrate, the imageable element can be enclosed in water-impermeable material that substantially inhibits the transfer of moisture to and from the imageable element as described in U.S. Pat. No. 7,175,969 (noted above) that is incorporated herein by reference.

Imaging Conditions

During use, the imageable element is exposed to a suitable source of imaging or exposing radiation, such as near-infrared or infrared radiation, depending upon the radiation absorbing compound present in the radiation-sensitive composition, at a wavelength of from about 700 to about 1500 nm. For example, imaging can be carried out using imaging or exposing radiation, such as from an infrared laser at a wavelength of at least 700 nm and up to and including about 1400 nm and typically at least 750 nm and up to and including 1250 nm. Imaging can be carried out using imaging radiation at multiple wavelengths at the same time if desired.

The laser used to expose the imageable element is usually a diode laser, because of the reliability and low maintenance of diode laser systems, but other lasers such as gas or solid-state lasers may also be used. The combination of power, intensity and exposure time for laser imaging would be readily apparent to one skilled in the art. Presently, high performance lasers or laser diodes used in commercially available imagesetters emit infrared radiation at a wavelength of at least 800 nm and up to and including 850 nm or at least 1060 and up to and including 1120 nm.

The imaging apparatus can function solely as a platesetter or it can be incorporated directly into a lithographic printing press. In the latter case, printing may commence immediately after imaging and development, thereby reducing press set-up time considerably. The imaging apparatus can be configured as a flatbed recorder or as a drum recorder, with the imageable member mounted to the interior or exterior cylindrical surface of the drum. An example of an useful imaging apparatus is available as models of Kodak® Trendsetter platesetters available from Eastman Kodak Company (Burnaby, British Columbia, Canada) that contain laser diodes that emit near infrared radiation at a wavelength of about 830 nm. Other suitable imaging sources include the Crescent 42T Platesetter that operates at a wavelength of 1064 nm (available from Gerber Scientific, Chicago, Ill.) and the Screen PlateRite 4300 series or 8600 series platesetter (available from Screen, Chicago, Ill.). Additional useful sources of radiation include direct imaging presses that can be used to image an element while it is attached to the printing plate cylinder. An example of a suitable direct imaging printing press includes the Heidelberg SM74-DI press (available from Heidelberg, Dayton, Ohio).

Imaging with infrared radiation can be carried out generally at imaging energies of at least 30 $mJ/cm^2$ and up to and including 500 $mJ/cm^2$, and typically at least 50 and up to and including 300 $mJ/cm^2$ depending upon the sensitivity of the imageable layer.

While laser imaging is desired in the practice of this invention, imaging can be provided by any other means that provides thermal energy in an imagewise fashion. For example, imaging can be accomplished using a thermoresistive head (thermal printing head) in what is known as "thermal printing", described for example in U.S. Pat. No. 5,488,025 (Martin et al.). Thermal print heads are commercially available (for example, a Fujitsu Thermal Head FTP-040 MCS001 and TDK Thermal Head F415 HH7-1089).

Development and Printing

Imaging of the imageable element produces an imaged element that comprises a latent image of imaged (exposed) and non-imaged (non-exposed) regions. Developing the imaged element with a suitable developer or processing solution removes predominantly only the non-exposed regions of the various layers and reveals the hydrophilic surface of the substrate. Thus, the imageable elements are "negative-working" (for example, negative-working lithographic printing plate precursors). The exposed (or imaged) regions accept ink while the substrate in the non-exposed (or non-imaged) regions repels ink.

Development can be carried out for a time sufficient off-press to remove the non-imaged (non-exposed) regions of the imaged element, but not long enough to remove the exposed regions. Thus, the non-imaged (non-exposed) regions of the imageable layer are described as being "soluble" or "removable" in the developer or processing solution because they are removed, dissolved, or dispersed within the developer or processing solution more readily than the imaged exposed) regions. Thus, the term "soluble" also means "dispersible".

Useful developers for off-press development include organic solvent-containing alkaline developers that generally have a pH below 12 and are generally single-phase solutions of one or more organic solvents that are miscible with water, such as 2-ethylethanol and 2-butoxyethanol. Representative solvent-containing alkaline developers include ND-1 Developer, 955 Developer, 956 Developer, 989 Developer, and 980 Developer (all available from Eastman Kodak Company), HDN-1 Developer (available from Fuji), and EN 232 Developer (available from Agfa).

Generally, the developer is applied to the imaged element by rubbing or wiping the outer layer with an applicator containing the developer. Alternatively, the imaged element can be brushed with the developer or the developer may be applied by spraying the outer layer with sufficient force to remove the exposed regions. The imaged element can be immersed in the developer. In all instances, a developed image is produced, particularly in a lithographic printing plate having a hydrophilic aluminum-containing substrate of this invention.

Following development, the imaged element can be rinsed with water and dried in a suitable fashion. The dried element can also be treated with a conventional gumming solution (preferably gum arabic).

A postbake operation can be carried out, with or without a blanket or floodwise exposure to UV or visible radiation. The imaged and developed element can be baked in a postbake operation to increase run length of the resulting printing plate. Baking can be carried out, at from about 220° C. to about 240° C. for from about 7 to about 10 minutes, or at about 120° C. for 30 minutes. Alternatively, a blanket UV or visible radiation exposure can be carried out, without a postbake operation.

A lithographic ink and fountain solution can be applied to the printing surface of the imaged element for printing. The exposed (non-removed) regions of the outermost layer take up ink and the hydrophilic surface of the substrate revealed by the imaging and development process takes up the fountain solution. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means and chemicals.

Alternatively, with or without a post-exposure baking (or pre-heat) step after imaging and before processing, the imaged elements can be processed off-press using a single processing solution that both "develops" the imaged precursors by removing predominantly only the non-exposed regions (development) and also provides a protective layer or coating over the entire imaged and developed surface. In this second aspect, the processing solution can behave somewhat like a gum that is capable of protecting the lithographic image on the printing plate against contamination or damage (for example, from oxidation, fingerprints, dust, or scratches). The processing solution is an aqueous solution that generally has a pH greater than 2 and up to about 11.5, and typically from about 6 to about 11, or from about 6 to about 10.5, as adjusted using a suitable amount of an acid or base. Further details of such processing solutions, their components, and their use to develop imaged negative-working imageable elements are provided in copending and commonly assigned U.S. Ser. No. 11/949,817 (filed Dec. 4, 2007 by K. Ray, Tao, and Clark) that is incorporated herein by reference.

Generally, after imaging, this single processing solution can be applied to the imaged precursor by rubbing, spraying, jetting, dipping, immersing, coating, or wiping the outer layer with the single processing solution or contacting the imaged precursor with a roller, impregnated pad, or applicator containing the single processing solution. For example, the imaged element can be brushed with the processing solution, or the processing solution can be poured onto or applied by spraying the imaged surface with sufficient force to remove the exposed regions using a spray nozzle system as described for example in [0124] of EP 1,788,431A2 (noted above). Still again, the imaged element can be immersed in the single processing solution and rubbed by hand or with an apparatus.

The single processing solution can also be applied in a processing unit (or station) as a component of a suitable apparatus that has at least one roller for rubbing or brushing the precursor while the single processing solution is applied. By using such a processing unit, the exposed regions of the imaged layer may be removed from the substrate more completely and quickly. Residual single processing solution may be removed (for example, using a squeegee or nip rollers) or left on the resulting printing plate (and dried) without any rinsing step. It is desirable that processing be carried out using processor systems and apparatus that allow the processing solution to reside on the imaged precursor for sufficient time of interaction between the processing solution and the precursor imaged coatings before mechanical means (such as brush or plush rollers) are used.

In many embodiments of this invention, the imaged negative-working imageable element can be developed "on-press" as described in more detail below. In most embodiments, a post-exposure baking step is omitted. On-press development avoids the use of alkaline developing solutions typically used in conventional processing apparatus. The imaged element is mounted on press wherein the unexposed regions in the imageable layer are removed by a suitable fountain solution, lithographic printing ink, or a combination of both, when the initial printed impressions are made. Typical ingredients of aqueous fountain solutions include pH buffers, desensitizing agents, surfactants and wetting agents, humectants, low boiling solvents, biocides, antifoaming agents, and sequestering agents. A representative example of a fountain solution is Varn Litho Etch 142W+Varn PAR (alcohol sub) (available from Varn International, Addison, Ill.).

The fountain solution is taken up by the non-imaged regions, that is, the surface of the hydrophilic substrate revealed by the imaging and development steps, and ink is taken up by the imaged (non-removed) regions of the imaged layer. The ink is then transferred to a suitable receiving material (such as cloth, paper, metal, glass, or plastic) to provide a desired impression of the image thereon. If desired, an intermediate "blanket" roller can be used to transfer the ink from the imaged member to the receiving material. The imaged members can be cleaned between impressions, if desired, using conventional cleaning means.

The following examples are provided to illustrate the practice of the invention but are by no means intended to limit the invention in any manner.

EXAMPLES

Unless otherwise noted below, the chemical components used in the Examples can be obtained from one or more commercial courses such as Aldrich Chemical Company (Milwaukee, Wis.).

The components and materials used in the examples and analytical methods used in evaluation were as follows:

Byk® 336 is a surfactant that is available from Byk Chemie (Wallingford, Conn.).

Blue 63 is a spirolactone leuco dye from Yamamoto Chemicals (Japan) having the following structure:

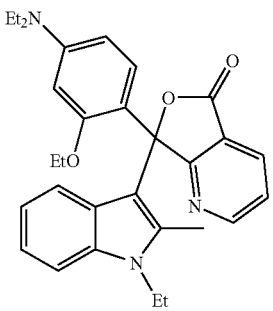

Graft Polymer A was a graft copolymer of acrylonitrile/styrene/poly(ethylene glycol), 70/20/10 used at a 24% solids in n-propanol/water (76/24). This polymer is described as Copolymer 10 in U.S. Pat. No. 7,261,998 (Hayashi et al.).

Initiator A is bis(4-t-butylphenyl) iodonium tetraphenylborate.

IR Dye A is a cyanine infrared radiation absorbing dye having the following structure:

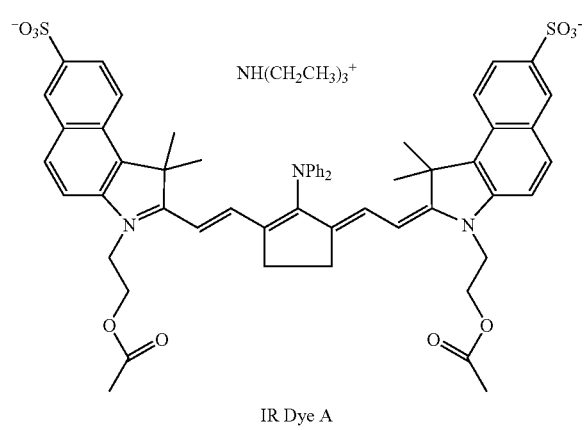

IR Dye A

Irgacure® 250 is iodonium, (4-methylphenyl)[4-(2-methylpropyl)phenyl]-, hexafluorophosphate that is available from Ciba Specialty Chemicals (Tarrytown, N.Y.).

Klucel E is a hydroxypropyl cellulose material that is available from Hercules Inc. (Wilmington, Del.).

Masurf® 1520 is a fluorosurfactant that was obtained from Mason Chemicals (Arlington Heights, Ill.).

MEHQ represents hydroquinone monomethyl ether (also known as 4-methoxyphenol).

MEK represents methyl ethyl ketone.

Oligomer A is a urethane acrylate prepared by reacting DESMODUR® N100 (an aliphatic polyisocyanate resin based on hexamethylene diisocyanate from Bayer Corp., Milford, Conn.) with hydroxyethyl acrylate and pentaerythritol triacrylate (800 wt. % solution in 2-butanone).

Sartomer SR494 is ethoxylated pentaerythritol tetraacrylate that was obtained from Sartomer Company, Inc. (Exton, Pa.).

Sipomer PAM-100 is an ethylene glycol methacrylate phosphate having 4-5 ethylene glycol units that was obtained from Rhodia (Cranbury, N.J.).

SLE-A is a poly(ethylene glycol) diacid (MW-600).

SLE-B is an 1-[N-[poly(3-allyloxy-2-hydroxypropyl)]-2-aminoethyl]-2-imidazlidinone.

Synthetic Example 1

Interlayer Compound A (IC-A)

Step 1: MEK (330.8 g, dried over molecular sieve), 100 g of Jeffamine ED-2003 (0.10 equivalents, a polyether diamine having predominantly polyethylene glycol backbone, MW=2000, available from Huntsman), and 5.06 g of triethylamine (0.05 equivalents) were charged into a four-neck 1000 ml flask, equipped with a heating mantle, temperature controller, mechanical stirrer, condenser, pressure equalized addition funnel, and nitrogen inlet. Then, 5.22 g (0.05 equivalents) of methacryloyl chloride were added at 25° C. in 15 minutes while maintaining reaction temperature less than 35° C. The temperature was raised two hours later to 50° C. and stirred another hour. Reaction mixture was cooled to room temperature. Triethylamine hydrochloride (TEA:HCl salt) was removed by filtration. MEHQ (0.055 g) was added to the solution. MEK was removed under vacuum (100 mm) and heat (45° C.). About 100 g of intermediate was obtained.

Step 2: The intermediate from Step 1 (52.8 g, 0.022 equivalents), 50.0 g of MEK (dried over molecular sieve), and 0.05 g of MEHQ were charged into a four-neck 250 ml flask, equipped with a heating mantle, temperature controller, mechanical stirrer, condenser, pressure equalized addition funnel, and nitrogen inlet. The reaction mixture was heated to 30° C. and 4.95 g of 3-(triethoxysilyl) propyl isocyanate (0.02 equivalents) was added in ten minutes. Reaction mixture was maintained at 30° C. for two hours. Completion of the reaction was determined by the disappearance of the isocyanate infrared absorption band at 2275 cm$^{-1}$. MEK was removed under vacuum (100 mm) and heat (45° C.). About 55 g of sticky material was obtained that was subsequently dissolved in water (10% wt solution) for further use. The 10% aqueous solution was clear.

Synthetic Example 2

Interlayer Compound A1 (IC-A1)

Step 1: MEK (331.9 g, dried over molecular sieve), 90 g of Jeffamine ED-900 (0.20 equivalents, a polyether diamine having predominantly polyethylene glycol backbone, MW=2000, available from Huntsman), and 10.19 g of triethylamine (0.1 equiv.) were charged into a four-neck 1000 ml flask, equipped with a heating mantle, temperature controller, mechanical stirrer, condenser, pressure equalized addition funnel, and nitrogen inlet. Then, 10.45 g (0.1 equiv.) of methacryloyl chloride were added at 25° C. in 15 minutes while maintaining reaction temperature less than 35° C. The temperature was raised two hours later to 50° C. and stirred another hour. Reaction mixture was cooled to room temperature. Triethylamine hydrochloride (TEA:HCl salt) was removed by filtration. MEHQ (0.055 g) was added to the solution. MEK was removed under vacuum (100 mm) and heat (45° C.). About 90 g of intermediate was obtained.

Step 2: The intermediate from Step 1 (35.5 g, 0.033 equiv.), 59.2 g of MEK (dried over molecular sieve), and 0.03 g of MEHQ were charged into a four-neck 250 ml flask, equipped with a heating mantle, temperature controller, mechanical stirrer, condenser, pressure equalized addition funnel, and nitrogen inlet. The reaction mixture was heated to 30° C. and 7.42 g of 3-(triethoxysilyl)propyl isocyanate was added in fifteen minutes. Reaction mixture was maintained at 30° C. for two hours. Completion of the reaction was determined by the disappearance of the isocyanate infrared absorption band at 2275 cm$^{-1}$. MEK was removed under vacuum (100 mm) and heat (45° C.). About 39 g of sticky material was obtained that was subsequently dissolved in water (10% wt solution) for further use. The 10% aqueous solution was slightly hazy.

Comparative Synthetic Example 1

Interlayer Compound B (IC-B)

Step 1: MEK (330.8 g, dried over molecular sieve), 100.0 g of polyethylene glycol (0.10 equivalents, MW=2000, available from Alfa Aesar), and 5.06 g of triethylamine (0.05 equivalents) were charged into a four-neck 1000 ml flask, equipped with a heating mantle, temperature controller, mechanical stirrer, condenser, pressure equalized addition funnel, and nitrogen inlet. Then, 5.22 g (0.05 equivalents) of methacryloyl chloride were added at 25° C. in 15 minutes while maintaining reaction temperature less than 35° C. Temperature was raised two hours later to 50° C. and stirred another hour. Reaction mixture was cooled to room temperature. Triethylamine hydrochloride (TEA:HCl salt) was removed by filtration. MEHQ (0.055 g) was added to the solution and MEK was removed under vacuum (100 mm) and heat (45° C.). About 90 g of an intermediate was obtained.

Step 2: The intermediate from Step 1 (56.9 g, 0.0275 equivalents), 63.4 g of MEK (dried over molecular sieve), 0.05 g of MEHQ, and 0.315 g of $D_{22}$ (Dibutyl Tin Dilaurate) were charged into a four-neck 250 ml flask, equipped with a heating mantle, temperature controller, mechanical stirrer, condenser, pressure equalized addition funnel, and nitrogen inlet. The reaction mixture was heated to 60° C. and 6.18 g of 3-(triethoxysilyl)propyl isocyanate (0.025 equivalents) were added over twenty minutes. The reaction mixture was maintained at 60° C. for 3 hours. Completion of the reaction was determined by the disappearance of the isocyanate infrared absorption band at 2275 cm$^{-1}$. MEK was removed under vacuum (100 mm) and heat (45° C.). About 60 g of sticky material was obtained that was subsequently dissolved in water (10% wt. solution) for further use. The 10% aqueous solution was slightly cloudy.

Comparative Synthetic Example 2

Interlayer Compound C (IC-C)

Step 1: MEK (383.8 g, dried over molecular sieve), 112.5 g of polyethylene glycol (0.15 equivalents, MW=1500, available from Alfa Aesar), and 7.59 g of triethylamine (0.075 equivalents) were charged into a four-neck 1000 ml flask, equipped with a heating mantle, temperature controller, mechanical stirrer, condenser, pressure equalized addition funnel, and nitrogen inlet. Then, 7.84 g (0.075 equivalents) of methacryloyl chloride were added at 25° C. over 15 minutes while maintaining reaction temperature less than 35° C. The temperature was raised two hours later to 50° C. and stirred another hour. The reaction mixture was cooled to room temperature. Triethylamine hydrochloride (TEA:HCl salt) was removed by filtration and 0.0825 g of MEHQ was added to the solution. MEK was removed under vacuum (100 mm) and heat (45° C.). About 110 g of an intermediate was obtained.

Step 2: The intermediate of Step 1 (51.8 g, 0.033 equivalents), 110.6 g of MEK (dried over molecular sieve), 0.05 g of MEHQ, and 0.3 g of $D_{22}$ (Dibutyl Tin Dilaurate) were charged into a four-neck 250 ml flask, equipped with a heating mantle, temperature controller, mechanical stirrer, condenser, pressure equalized addition funnel, and nitrogen inlet. The reaction mixture was heated to 60° C. and 7.42 g of 3-(triethoxysilyl)propyl isocyanate (0.03 equivalents) were added in twenty minutes. The reaction mixture was maintained at 60° C. for 3 hours. Completion of reaction was determined by the disappearance of isocyanate infrared absorption band at 2275 $cm^{-1}$. MEK was removed under vacuum (100 mm) and heat (45° C.). About 55 g of liquid material were obtained that was subsequently dissolved in water (10% wt. solution) for further use. The 10% aqueous solution was slightly cloudy.

Comparative Synthetic Example 3

Interlayer Compound D (IC-D)

Step 1: MEK (361.5 g, dried over molecular sieve), 100.0 g of polyethylene glycol (0.20 equivalents, MW=1000), available from Alfa Aesar], and 10.19 g of triethylamine (0.10 equivalents) were charged into a four-neck 1000 ml flask, equipped with a heating mantle, temperature controller, mechanical stirrer, condenser, pressure equalized addition funnel, and nitrogen inlet. Then, 10.43 g (0.10 equivalents) of methacryloyl chloride were added at 25° C. over 15 minutes while maintaining reaction temperature to a maximum of 35° C. and stirred an additional 3 hours. The reaction mixture was cooled to room temperature. Triethylamine hydrochloride salt was removed and 0.056 g of MEHQ was added. MEK was removed under vacuum (100 mm) and heat (45° C.) to provide 105 g of an intermediate.

Step 2: The intermediate from Step 1 (58.8 g, 0.055 equivalents), 71.2 g of MEK, dried over molecular sieve), 0.05 g of MEHQ, and 0.36 g of $D_{22}$ (Dibutyl Tin Dilaurate) were charged into a four-neck 250 ml flask, equipped with a heating mantle, temperature controller, mechanical stirrer, condenser, pressure equalized addition funnel, and nitrogen inlet. The mixture was heated to 60° C. and 12.36 g of 3-(triethoxysilyl)propyl isocyanate (0.05 equivalents) were added over twenty minutes. The reaction mixture was maintained at 60° C. for two hours. Completion of reaction was determined by the disappearance of the isocyanate infrared absorption band at 2275 $cm^{-1}$. MEK was removed under vacuum (100 mm) and heat (45° C.) and 75.6 g of sticky material was obtained that was subsequently dissolved in water (10% wt. solution) for further use. The 10% aqueous solution was cloudy.

Comparative Synthetic Example 4

Interlayer Compound E (IC-E)

MEK (77.3 g, dried over molecular sieve) and 24.73 g of 3-(triethoxysilyl)propyl isocyanate (0.10 equivalents) were charged into a four-neck 250 ml flask, equipped with a heating mantle, temperature controller, mechanical stirrer, condenser, pressure equalized addition funnel, and nitrogen inlet. The mixture was heated to 60° C. and a pre-mixture of 52.6 g of poly(ethylene glycol) methacrylate (0.10 equivalents, MW=526) was added over thirty minutes. The reaction mixture was maintained at 60° C. for 3 hours. Completion of reaction was determined by the disappearance of the isocyanate infrared absorption band at 2275 $cm^{-1}$. MEK was removed under vacuum (100 mm) and heat (45° C.) to provide 75 g of liquid material that was subsequently dissolved in water (10% wt. solution) for further use. The 10% aqueous solution was cloudy (milky-like).

Comparative Substrate Example 1

Preparation of Substrate U (No Interlayer)

This example illustrates the preparation of Substrate U, an aluminum lithographic substrate without an interlayer. A 0.30 mm thick aluminum sheet was alkaline cleaned, electrochemically grained with hydrochloric acid, etched in a caustic solution, anodized in sulfuric acid, and thoroughly rinsed and dried using conventional procedures. The resultant non-post-treated Substrate U had a $D_{min}$ of about 0.36 (K), oxide weight of about 2.5 $g/m^2$, and a Ra roughness of about 0.58 µm. The oxide layer had a thickness of about 1 µm. The Substrate U was found to repel ink when tested on commercial ABDick printing press.

Substrate Example 1

Preparation of Substrate A (IC-A Interlayer on Substrate U)

This example illustrates the preparation of Substrate A. An interlayer coating formulation was prepared by dissolving IC-A (4.55 g, 10% in water) and Masurf® 1520 (1.36 g, 1% in water) in isopropyl alcohol (4.18 g) and water (89.91 g). This formulation was slot coated onto a sample of Substrate U described above and was dried on a rotating drum at about 200® F. (93.3° C.) for 80 seconds to provide a thin interlayer with a coating weight of about 0.06 $g/m^2$. The resulting substrate was found to repel ink when tested on a commercial ABDick printing press.

Substrate Example 2

Preparation of Substrate A1 (IC-A1 Interlayer on Substrate U)

This example illustrates the preparation of Substrate A. An interlayer coating formulation was prepared by dissolving IC-A1 (4.55 g, 10% in water) and Masurf® 1520 (1.36 g, 1% in water) in isopropyl alcohol (4.18 g) and water (89.91 g). This formulation was coated onto a sample of Substrate U described above and was dried on a rotating drum at about 200° F. (93.3° C.) for 80 seconds to provide a thin interlayer with a coating weight of about 0.06 $g/m^2$. The resulting substrate was found to repel ink when tested on a commercial ABDick printing press.

Comparative Substrate Example 2

Preparation of Substrate B (an IC-B Interlayer on Substrate U)

This example illustrates the preparation of Substrate B. A coating formulation was prepared by dissolving IC-B (4.55 g, 10% in water) and Masurf® 1520 (1.36 g, 1% in water) in isopropyl alcohol (4.18 g) and water (89.91 g). This formulation was slot coated onto as sample of Substrate U that is described above, and was dried on a rotating drum at about 93.3° C. for 80 seconds to provide a thin interlayer with a dry coating weight of about 0.06 g/m². The resulting substrate was found to repel ink when tested on a commercial ABDick printing press.

Comparative Substrate Example 3

Preparation of Substrate C (an IC-C Inter Layer on Substrate U)

This example illustrates the preparation of Substrate C. A coating formulation was prepared by dissolving IC-C (4.55 g, 10% in water) and Masurf® 1520 (1.36 g, 1% in water) in isopropyl alcohol (4.18 g) and water (89.91 g). This formulation was slot coated onto a sample of Substrate U that is described above, and was dried on a rotating drum at about 93.3° C. for 80 seconds to provide a thin interlayer with a dry coating weight of about 0.06 g/m². The resulting substrate was found to repel ink when tested on a commercial ABDick printing press.

Comparative Substrate Example 4

Preparation of Substrate D (an IC-D Interlayer on Substrate U)

This example illustrates the preparation of Substrate D. A coating formulation was prepared by dissolving IC-D (4.55 g, 10% in water) and Masurf® 1520 (1.36 g, 1% in water) in isopropyl alcohol (4.18 g) and water (89.91 g). This formulation was slot coated onto a sample of Substrate U that is described above, and was dried on a rotating drum at about 93.3° C. for 80 seconds to provide a thin interlayer with a dry coating weight of about 0.06 g/m². The resulting substrate was found to repel ink when tested on a commercial ABDick printing press.

Comparative Substrate Example 5

Preparation of Substrate E (an IC-E Interlayer on Substrate U)

This example illustrates the preparation of Substrate E. A coating formulation was prepared by dissolving IC-E (4.55 g, 10% in water) and Masurf® 1520 (1.36 g, 1% in water) in isopropyl alcohol (4.18 g) and water (89.91 g). This formulation was slot coated onto a sample of Substrate U that is described above, and was dried on a rotating drum at about 93.3° C. for 80 seconds to provide a thin interlayer with a dry coating weight of about 0.06 g/m². The resulting substrate accepted ink when tested on a commercial ABDick printing press, and was removed for further testing.

Invention Example 1

On-Press Developable Imageable Elements (A) with Substrate A

The imageable layer coating composition shown below in TABLE I was prepared to give a 4.5% w/w solution in a solvent mixture of 70% n-propanol, 20% MEK, and 10% water. The composition was applied to samples of Substrate A using a slot coater at 2.5 cm³/ft² (26.9 cm³/m²) and dried to give a dry imageable layer coverage of 1.0 g/m². The coating drum temperature was 82.2° C. and the duration was 80 seconds. After cooling to room temperature, an on-press developable imageable element (lithographic printing plate precursor) was obtained.

Samples of the imageable elements were treated under various conditions in order to accelerate the effects of plate ageing. In one test, the imageable elements were wrapped in interleaving and foil and then treated for 5 days at 48° C. (dry aging test). In another test, the imageable elements were hung in a humidity chamber for 5 days at 38° C. and 80% relative humidity (humidity aging test). In still another test, the imageable elements were placed at room temperature in dark (inside a cardboard box) for 5-10 days (natural aging test).

All samples of the imageable elements after the various aging conditions (natural, dry and humidity aging) were exposed from 50 to 125 mJ/cm² on a Kodak® Trendsetter 3244x platesetter. The imaged elements were then directly mounted on a commercial ABDick duplicator press charged with Van Son rubber-based black ink. The fountain solution was Varn 142W etch at 3 oz per gallon (23.4 ml/liter) and PAR alcohol replacement at 3 oz per gallon (23.4 ml/liter). The printing press was run for 200 impressions and the development of the printing plates was then assessed using the 200th sheet by visual evaluation as follows: (see TABLE II below for the development results)
  1: good quality image at 50 mJ/cm², clean background.
  2: clear differentiation between exposed and non-exposed areas, not completely clean in the background.
  3: no differentiation between exposed and non-exposed areas, both having ink heavily.

The imageable elements (A) in this example exhibited very good development (background clean) after both dry aging and humidity aging tests.

In a press run length test, the imageable elements (A) provided 20,000 good impressions on a Komori press using a wear ink containing 1.5% calcium carbonate, after exposing at 150 mJ/cm² at 15 watts on the Kodak® Trendsetter 3244x platesetter.

Invention Example 2

On-Press Developable Imageable Elements (A1) with Substrate A1

The imageable layer coating composition shown below in TABLE I was prepared to give a 4.5% w/w solution in a solvent mixture of 70% n-propanol, 20% MEK, and 10% water. The composition was applied to samples of Substrate A1 using a slot coater at 2.5 cm³/ft² (26.9 cm³/m²) and dried to give a dry imageable layer coverage of 1.0 g/m². The coating drum temperature was 82.2° C. and the duration was 80 seconds. After cooling to room temperature, an on-press developable imageable element (lithographic printing plate precursor) was obtained.

Samples of the imageable elements were treated under various conditions in order to accelerate the effects of plate ageing. In one test, the imageable elements were wrapped in interleaving and foil and then treated for 5 days at 48° C. (dry aging test). In another test, the imageable elements were hung in a humidity chamber for 5 days at 38° C. and 80% relative humidity (humidity aging test). In still another test, the imageable elements were placed at room temperature in dark (inside a cardboard box) for 5-10 days (natural aging test).

All samples of the imageable elements after the various aging conditions (natural, dry and humidity aging) were exposed from 50 to 125 mJ/cm² on a Kodak® Trendsetter 3244x platesetter. The imaged elements were then directly mounted on a commercial ABDick duplicator press charged with Van Son rubber-based black ink. The fountain solution was Varn 142W etch at 3 oz per gallon (23.4 ml/liter) and PAR alcohol replacement at 3 oz per gallon (23.4 ml/liter). The printing press was run for 200 impressions and the development of the printing plates was then assessed using the 200th sheet by visual evaluation as follows: (see TABLE II below for the development results)

1: good quality image at 50 mJ/cm², clean background.
2: clear differentiation between exposed and non-exposed areas, not completely clean in the background.
3: no differentiation between exposed and non-exposed areas, both having ink heavily.

The imageable elements (A1) in this example exhibited very good development (background clean) after both dry aging and humidity aging tests.

In a press run length test, the imageable elements (A1) provided 17,000 good impressions on a Komori press using a wear ink containing 1.5% calcium carbonate, after exposing at 150 mJ/cm² at 15 watts on the Kodak® Trendsetter 3244x platesetter.

Comparative Examples 1-4

On-Press Developable Imageable Elements (U), (B), (C) and (D) with Substrates U, B, C and D Each of the imageable layer coating compositions shown below in TABLE I was prepared to give a 4.5% w/w solution in a solvent mixture of 70% n-propanol, 20% MEK, and 10% water. Each of the compositions was applied to samples of Substrates U, B, C and D respectively, using a slot coater at 2.5 cm³/ft² (26.9 cm³/m²) and dried to give a dry imageable layer coverage of 1.0 g/m². The coating drum temperature was 82.2° C. and the duration was 80 seconds. After cooling to room temperature, four imageable elements (lithographic printing plate precursors) were obtained.

Samples of the imageable elements were treated under various conditions as described above for the Invention Example 1. All of the imageable elements after various aging conditions (natural, dry and humidity aging) were exposed as described for Invention Example 1 and then directly mounted on an ABDick duplicator press as described above. The printing press was run for 200 impressions and then the development was assessed by visual evaluation as described for Invention Example 1 (see TABLE II above).

Imageable elements (U) and (D) in this example showed very poor development (strong background retaining) after both dry aging and humidity aging tests.

The imageable elements (B) and (C) in this example showed good development (background clean) after both dry aging test and humidity aging test.

In press run length tests, the imageable elements (B) and (C) provided only 15,000 and 10,000 good impressions, respectively, on a Komori press with a wear ink containing 1.5% calcium carbonate, after exposing at 150 mJ/cm² at 15 watts on a Kodak® Trendsetter 3244x platesetter.

TABLE I

| Components | Composition (% of components in solid by weight) |
|---|---|
| Oligomer A | 10.67 |
| Graft polymer A | 39.44 |
| Initiator A | 5.45 |

TABLE I-continued

| Components | Composition (% of components in solid by weight) |
|---|---|
| Irgacure ® 250 | 2.99 |
| Klucel E | 3.99 |
| IR Dye A | 3.99 |
| Byk ® 336 | 2.26 |
| Sipomer PAM-100 | 1.49 |
| Sartomer SR 494 | 16.78 |
| Blue 63 | 3.99 |
| SLE-A | 5.97 |
| SLE-B | 2.99 |

TABLE II

| Imageable Element | Natural aging | Dry aging | Humidity aging |
|---|---|---|---|
| Imageable elements (A) | 1 | 1 | 1 |
| Imageable elements (A1) | 1 | 1 | 1 |
| Imageable elements (U) | 1 | 3 | 3 |
| Imageable elements (B) | 1 | 1 | 1 |
| Imageable elements (C) | 1 | 1 | 1 |
| Imageable elements (D) | 1 | 2 | 3 |

The invention has been described in detail with particular reference to certain preferred embodiments thereof, but it will be understood that variations and modifications can be effected within the spirit and scope of the invention.

The invention claimed is:

1. A substrate comprising a metal or polymer support having thereon an interlayer comprising a trialkoxysilyl polyethylene glycol acrylate having the following Structure (I):

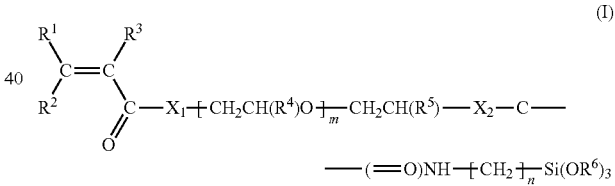

wherein $R^1$ and $R^2$ are independently hydrogen or $C_1$ to $C_6$ alkyl, $C_1$ to $C_6$ alkenyl, $C_1$ to $C_6$ alkoxy, $C_1$ to $C_6$ acyl, $C_1$ to $C_6$ acyloxy, phenyl, halo, or cyano groups, or $R^1$ and $R^2$ together can form a cyclic group, $R^3$ is hydrogen, or a $C_1$ to $C_6$ alkyl, phenyl, halo, or cyano group, $R^4$ and $R^5$ are independently hydrogen or methyl groups, $R^6$ is hydrogen or a $C_1$ to $C_{12}$ alkyl group, $X_1$ is —O— or —NR— wherein R is hydrogen or an alkyl or aryl group, $X_2$ is —NR'— wherein R' is hydrogen or an alkyl or aryl group, m is an integer of from 15 to 200, and n is an integer of from 1 to 12.

2. The substrate of claim 1 wherein $R^1$ and $R^2$ are independently hydrogen or a $C_1$ to $C_4$ alkyl group or phenyl group, $R^3$ is hydrogen or a $C_1$ to $C_3$ alkyl or phenyl group, $R^6$ is a $C_1$ to $C_4$ alkyl group, $X_1$ is —O—, —NH—, or —NCH$_3$—, $X_2$ is —NH— or —NCH$_3$—, m is an integer of from 20 to 70, and n is an integer of from 2 to 6.

3. The substrate of claim 2 wherein $R^1$ and $R^2$ are independently hydrogen or methyl groups, $R_3$, $R_4$, and $R_5$ are independently hydrogen or methyl groups, $R^6$ is a methyl or ethyl group, $X_1$ is —O— or —NH—, and $X_2$ is —NH—, m is an integer of from 25 to 60, and n is an integer of from 2 to 4.

4. The substrate of claim 1 wherein said interlayer is present in a dry coverage of up to 0.1 g/m$^2$.

5. The substrate of claim 1 comprising an aluminum-containing support.

6. A negative-working imageable element comprising a substrate having disposed thereon an imageable layer that becomes more insoluble in a processing solution after exposure to imaging radiation, and said imageable element further comprising, between said substrate and said imageable layer:
   an interlayer comprising a trialkoxysilyl polyethylene glycol acrylate having the following Structure (I):

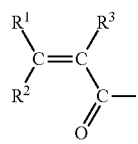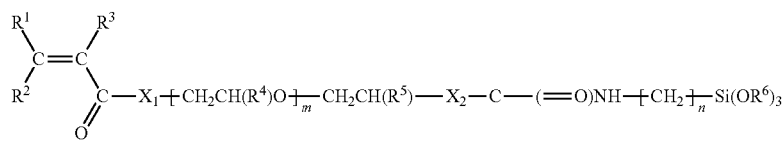

(I)

wherein $R^1$ and $R^2$ are independently hydrogen or $C_1$ to $C_6$ alkyl, $C_1$ to $C_6$ alkenyl, $C_1$ to $C_6$ alkoxy, $C_1$ to $C_6$ acyl, $C_1$ to $C_6$ acyloxy, phenyl, halo, or cyano groups, or $R^1$ and $R^2$ together can form a cyclic group, $R^3$ is hydrogen, or a $C_1$ to $C_6$ alkyl, phenyl, halo, or cyano group, $R^4$ and $R^5$ are independently hydrogen or methyl groups, $R^6$ is hydrogen or a $C_1$ to $C_{12}$ alkyl group, $X_1$ is —O— or —NR— wherein R is hydrogen or an alkyl or aryl group, $X_2$ is —NR'— wherein R' is hydrogen or an alkyl or aryl group, m is an integer of from 15 to 200, and n is an integer of from 1 to 12.

7. The imageable element of claim 6 that comprises a radiation absorbing compound.

8. The imageable element of claim 7 wherein said radiation absorbing compound is an infrared radiation absorbing compound.

9. A negative-working, on-press developable imageable element comprising a substrate having thereon an imageable layer comprising:
   a radically polymerizable component,
   an initiator composition capable of generating free radicals sufficient to initiate polymerization of free radically polymerizable groups upon exposure to imaging infrared radiation,
   a primary polymeric binder that has a backbone to which are attached pendant poly(alkylene oxide) side chains, cyano groups, or both, and is optionally present in the form of discrete particles, and
   an infrared radiation absorbing compound,
   said imageable element further comprising between said substrate and said imageable layer,
   an interlayer comprising a trialkoxysilyl polyethylene glycol acrylate having the following Structure (I):

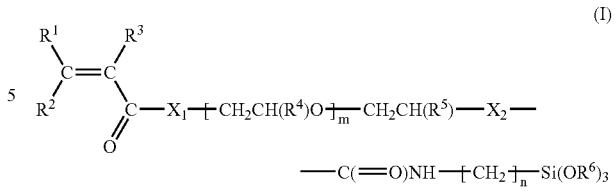

wherein $R^1$ and $R^2$ are independently hydrogen or $C_1$ to $C_6$ alkyl, $C_1$ to $C_6$ alkenyl, $C_1$ to $C_6$ alkoxy, $C_1$ to $C_6$ acyl, $C_1$ to $C_6$ acyloxy, phenyl, halo, or cyano groups, or $R^1$ and $R^2$ together can form a cyclic group, $R^3$ is hydrogen, or a $C_1$ to $C_6$ alkyl, phenyl, halo, or cyano group, $R^4$ and $R^5$ are independently hydrogen or methyl groups, $R^6$ is hydrogen or a $C_1$ to $C_{12}$ alkyl group, $X_1$ is —O— or —NR— wherein R is hydrogen or an alkyl or aryl group, $X_2$ is —NR'— wherein R' is hydrogen or an alkyl or aryl group, m is an integer of from 15 to 200, and n is an integer of from 1 to 12.

10. The imageable element of claim 9 wherein said radiation absorbing compound is an infrared radiation absorbing dye that is present in an amount of from about 0.5 to about 30% based on the total dry weight of said imageable layer.

11. The imageable element of claim 9 wherein said primary polymeric binder is in the form of discrete particles having an average particle size of from about 10 to about 500 nm, and is present in said imageable layer in an amount of at least 10% and up to 90% based on the total imageable layer dry weight.

12. The imageable element of claim 9 wherein said initiator composition comprises an iodonium compound, or the combination of a diaryliodonium cation and a boron-containing anion,
   wherein said diaryliodonium cation is represented by the following Structure (IB):

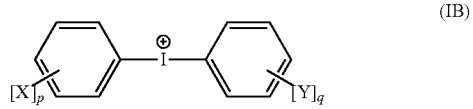

(IB)

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, provided that either p or q is at least 1, and said boron-containing anion is represented by the following Structure (IB$_Z$):

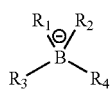

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom, such rings having up to 7 carbon, nitrogen, oxygen, or nitrogen atoms.

13. The imageable element of claim 9 wherein $R^1$ and $R^2$ are independently hydrogen or a $C_1$ to $C_4$ alkyl group or phenyl group, $R^3$ is hydrogen or a $C_1$ to $C_3$ alkyl or phenyl group, $R^6$ is a $C_1$ to $C_4$ alkyl group, $X_1$ is —O—, —NH—, or —NCH$_3$—, $X_2$ is —NH— or —NCH$_3$—, m is an integer of from 20 to 70, and n is an integer of from 2 to 6.

14. The imageable element of claim 1 wherein $R^1$ and $R^2$ are independently hydrogen or methyl groups, $R_3$, $R_4$, and $R_5$ are independently hydrogen or methyl groups, $R^6$ is a methyl or ethyl group, $X_1$ is —O— or —NH—, and $X_2$ is —NH—, m is an integer of from 25 to 60, and n is an integer of from 2 to 4.

15. The imageable element of claim 9 wherein said substrate comprises a sulfuric acid-anodized aluminum-containing support upon which said interlayer is disposed.

16. A method comprising:
   A) imagewise exposing the imageable element of claim 6 using infrared imaging radiation to produce exposed and non-exposed regions, and
   B) with or without a post-exposure baking step, developing said imagewise exposed element to remove predominantly only said non-exposed regions.

17. The method of claim 16 wherein said imageable element is an on-press developable negative-working printing plate precursor that is developed only in the presence of a fountain solution, lithographic printing ink, or a combination thereof.

18. The method of claim 16 wherein said imageable element comprises an infrared radiation absorbing dye, a primary polymeric binder that is in the form of discrete particles having an average particle size of from about 10 to about 500 nm, and is present in said imageable layer in an amount of at least 10% and up to 90% based on the total imageable layer dry weight, an initiator composition that comprises an iodonium compound, or the combination of a diaryliodonium cation and a boron-containing anion,
wherein said diaryliodonium cation is represented by the following Structure (IB):

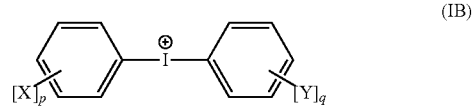

wherein X and Y are independently halo, alkyl, alkoxy, aryl, or cycloalkyl groups, or two or more adjacent X or Y groups can be combined to form a fused carbocyclic or heterocyclic ring with the respective phenyl groups, p and q are independently 0 or integers of 1 to 5, provided that either p or q is at least 1, and said boron-containing anion is represented by the following Structure(IB$_Z$):

wherein $R_1$, $R_2$, $R_3$, and $R_4$ are independently alkyl, aryl, alkenyl, alkynyl, cycloalkyl, or heterocyclyl groups, or two or more of $R_1$, $R_2$, $R_3$, and $R_4$ can be joined together to form a heterocyclic ring with the boron atom, such rings having up to 7 carbon, nitrogen, oxygen, or nitrogen atoms,
   in said interlayer, said trialkoxysilyl polyethylene glycol acrylate having Structure (I) has $R^1$ and $R^2$ that are independently hydrogen or a $C_1$ to $C_4$ alkyl group or phenyl group, $R^3$ that is hydrogen or a $C_1$ to $C_3$ alkyl or phenyl group, $R^6$ that is a $C_1$ to $C_4$ alkyl group, $X_1$ that is —O, —NH—, or —NCH$_3$—, $X_2$ that is —NH— or —NCH$_3$—, m that is an integer of from 20 to 70, and n that is an integer of from 2 to 6, and
   a substrate that comprises a sulfuric acid-anodized aluminum-containing support upon which said interlayer is disposed.

* * * * *